United States Patent
Ely et al.

(10) Patent No.: US 7,521,941 B2
(45) Date of Patent: *Apr. 21, 2009

(54) METHODS AND SYSTEMS FOR DETECTING A CAPACITANCE USING SWITCHED CHARGE TRANSFER TECHNIQUES

(75) Inventors: David Ely, Cambridge (GB); Paul Routley, Cambridge (GB); Joseph Kurth Reynolds, Sunnyvale, CA (US); Julian Haines, Dublin (IE); Kirk Hargreaves, Mountain View, CA (US)

(73) Assignee: Synaptics, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/925,496

(22) Filed: Oct. 26, 2007

(65) Prior Publication Data

US 2008/0042660 A1 Feb. 21, 2008

Related U.S. Application Data

(63) Continuation of application No. 11/446,323, filed on Jun. 3, 2006.

(60) Provisional application No. 60/687,012, filed on Jun. 3, 2005, provisional application No. 60/687,167, filed on Jun. 3, 2005, provisional application No. 60/687,148, filed on Jun. 3, 2005, provisional application No. 60/687,039, filed on Jun. 3, 2005, provisional application No. 60/687,037, filed on Jun. 3, 2005, provisional application No. 60/774,843, filed on Feb. 16, 2006.

(51) Int. Cl.
*G01R 27/26* (2006.01)

(52) U.S. Cl. ........................ 324/678; 324/658

(58) Field of Classification Search ................. 324/678, 324/679, 686, 688
See application file for complete search history.

(56) References Cited

U.S. PATENT DOCUMENTS 3,898,425 A 8/1975 Crandell et al.

(Continued)

FOREIGN PATENT DOCUMENTS

| DE | 3413849 | 8/1985 |
| EP | 1521090 | 5/2005 |
| EP | 1593988 | 11/2005 |

(Continued)

OTHER PUBLICATIONS

Touch Sensor IC (B6TS). Omron Corporation [retrieved on Aug. 14, 2006]. Retrieved from Internet: <URL:www.omron.co.jp/ecb/products/touch/pdf/en-keisoku.pdf>.

(Continued)

*Primary Examiner*—Vincent Q Nguyen
(74) *Attorney, Agent, or Firm*—Ingrassia, Fisher & Lorenz, P.C.

(57) ABSTRACT

Methods, systems and devices are described for detecting a measurable capacitance using charge transfer techniques. According to various embodiments, a charge transfer process is performed for two or more times. During the charge transfer process, a pre-determined voltage is applied to the measurable capacitance, and the measurable capacitance is then allowed to share charge with a filter capacitance through a passive impedance that remains coupled to both the measurable capacitance and to the filter capacitance throughout the charge transfer process. The value of the measurable capacitance can then be determined as a function of a representation of a charge on the filter capacitance and the number of times that the charge transfer process was performed. Such a detection scheme may be readily implemented using conventional components, and can be particularly useful in sensing the position of a finger, stylus or other object with respect to an input sensor.

26 Claims, 15 Drawing Sheets

U.S. PATENT DOCUMENTS

| | | | |
|---|---|---|---|
| 4,459,541 | A | 7/1984 | Fielden et al. |
| 5,012,124 | A | 4/1991 | Hollaway |
| 5,305,017 | A | 4/1994 | Gerpheide |
| 5,451,940 | A | 9/1995 | Schneider et al. |
| 5,543,591 | A | 8/1996 | Gillespie et al. |
| 5,659,254 | A | 8/1997 | Matsumoto et al. |
| 5,730,165 | A | 3/1998 | Philipp |
| 5,973,417 | A | 10/1999 | Goetz et al. |
| 6,323,846 | B1 | 11/2001 | Westerman et al. |
| 6,452,514 | B1 | 9/2002 | Philipp |
| 6,466,036 | B1 | 10/2002 | Philipp |
| 6,536,200 | B1 | 3/2003 | Schwartz |
| 6,593,755 | B1 | 7/2003 | Rosengren |
| 7,288,946 | B2 * | 10/2007 | Hargreaves et al. .......... 324/678 |
| 2003/0090277 | A1 | 5/2003 | Lechner et al. |
| 2004/0104826 | A1 | 6/2004 | Philipp |
| 2005/0068712 | A1 | 3/2005 | Schulz et al. |
| 2005/0099188 | A1 | 5/2005 | Baxter |

FOREIGN PATENT DOCUMENTS

| | | |
|---|---|---|
| FR | 2829317 | 3/2003 |
| JP | 3237594 | 10/1991 |
| WO | 2004059343 A1 | 7/2004 |
| WO | 2004066498 A1 | 8/2004 |
| WO | 2005031375 | 4/2005 |

OTHER PUBLICATIONS

Phillip, Hal; Fingering a Problem; New Electronics; Jan. 24, 2006; pp. 51-52; Retrieved from Internet: <URL:www.newelectronics.co.uk/articles/5676/fingering-a-problem.pdf>.

Cichocki, Andrzej et al.; A Switched Capacitor Interface for Capcaitive Sensors Based on Relaxation Oscillators; IEEE; Oct. 1990; pp. 797-799; vol. 39 No. 5.

Huang, S.M. et al.; Electronic Transducers for Industrial Measurement of Low Value Capacitances; J. Phys. E.: Sci. Instrum. 21; 1988; pp. 242-250.

Phillip, H.; Charge Transfer Sensing: Spread Spectrum Sensor Technology Blazes New Applications; Retrieved from Internet: <URL:www.qprox.com/background/white_paper.php.

Toth, F.; Design Method. for Low-Cost, High-Perf. Cap. Sensors; Delft Univ. of Tech.; 1997; Retrieved from Internet: <URL:www.exalondelft.nl/download/CapacitiveSensors.PDF>.

Yamada, M. et al.; A Switched-Capacitor Interface for Capacitive Pressure Sensors; IEEE; Feb. 1992; pp. 81-86; vol. 31, No. 1.

Johns, D.A.; Analog Integrated Circuit Design; 1997; pp. 542, 543; John Wiley & Sons.

Banks; Low Cost, Low Speed A/D Conversion for Embedded Systems; Byte Craft Limited (retrieved on Jul. 25, 2006); Retrieved from Internet: <URL: www.bytecraft.com/addaconv.html>.

Cao, Y. et al.; High-Accuracy Circuits for On-Chip Capacitance Ratio Testing or Sensor Readout; IEEE Transactions; Sep. 1994; pp. 637-639; vol. 41, No. 9.

Josefsson, O.; Ask the Applications Engineer: Using Sigma-Delta Converters—Part 1; Analog Dialogue 30th Anniversary Reader Bonus; 1997; pp. 29-33.

Norsworthy, S.; Effective Dithering of Sigma-Delta Modulators; AT&T Bell Laboratories; IEEE; 1992; pp. 1304-1307.

Martin, K.; A Voltage-Controlled Switch Capacitor Relaxation Oscillator; IEEE Journ. of Solid-State Circuits; Aug. 1981; pp. 412-414; vol. SC-16, No. 4.

Seguine, D.; Capacitive Key Scan; Cypress MicroSystems; Oct. 2004; version 4.1.

Seguine, D.; Capacitive Switch Scan; Cypress MicroSystems; Apr. 2005; version 4.2.

Quantum Research Group, "Secrets of a Successful QTouch™ Design", Quantum Research Application Note AN-KD02, Rev. 1.03, Oct. 2005, pp. 1-11.

Kremin, Victor et al., "Capacitance Sensing—Waterproof Capacitance Sensing—AN2398", Cypress Perform, Document No. 001-14501 Rev., Dec. 8, 2006, pp. 1-11.

* cited by examiner

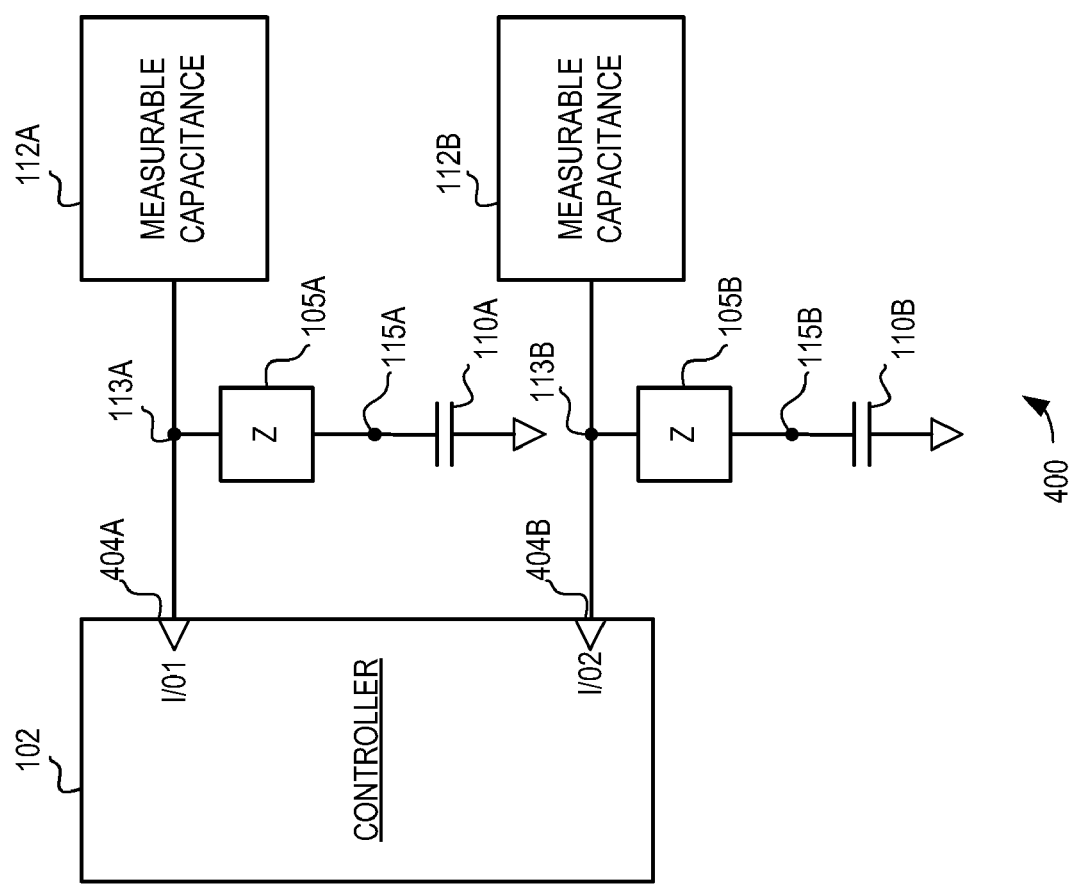

METHODS AND SYSTEMS FOR DETECTING A CAPACITANCE USING SWITCHED CHARGE TRANSFER TECHNIQUES

PRIORITY DATA

This application is a continuation of U.S. patent application Ser. No. 11/446,323, filed Jun. 3, 2006, which claims priority of U.S. Provisional Patent Application Ser. Nos. 60/687,012; 60/687,148; 60/687,167; 60/687,039; and 60/687,037, which were filed on Jun. 3, 2005 and Ser. No. 60/774,843 which was filed on Feb. 16, 2006, and are incorporated herein by reference.

TECHNICAL FIELD

The present invention generally relates to capacitance sensing, and more particularly relates to devices, systems and methods capable of detecting a measurable capacitance using switched charge transfer techniques.

BACKGROUND

Capacitance sensors/sensing systems that respond to charge, current, or voltage can be used to detect position or proximity (or motion, presence or any similar information), and are commonly used as input devices for computers, personal digital assistants (PDAs), media players and recorders, video game players, consumer electronics, cellular phones, payphones, point-of-sale terminals, automatic teller machines, kiosks and the like. Capacitive sensing techniques are used in applications such as user input buttons, slide controls, scroll rings, scroll strips and other types of inputs and controls. One type of capacitance sensor used in such applications is the button-type sensor, which can be used to provide information about the proximity or presence of an input. Another type of capacitance sensor used in such applications is the touchpad-type sensor, which can be used to provide information about an input such as the position, motion, and/or similar information along one axis (1-D sensor), two axes (2-D sensor), or more axes. Both the button-type and touchpad-type sensors can also optionally be configured to provide additional information such as some indication of the force, duration, or amount of capacitive coupling associated with the input. Examples of 1-D and 2-D touchpad-type sensors based on capacitive sensing technologies are described in United States Published Application 2004/0252109 A1 to Trent et al. and U.S. Pat. No. 5,880,411, which issued to Gillespie et al. on Mar. 9, 1999. Such sensors can be readily found, for example, in input devices of electronic systems including handheld and notebook-type computers.

A user generally operates capacitive input devices by placing or moving one or more fingers, styli, and/or other objects near a sensing region of the sensor(s) located on or in the input device. This creates a capacitive effect upon a carrier signal applied to the sensing region that can be detected and correlated to positional information (such as the position(s) or proximity or motion or presences or similar information) of the stimulus/stimuli with respect to the sensing region. This positional information can in turn be used to select, move, scroll, or manipulate any combination of text, graphics, cursors, highlighters, and/or other indicators on a display screen. This positional information can also be used to enable the user to interact with an interface, such as to control volume, to adjust brightness, or to achieve any other purpose.

Although capacitance sensors have been widely adopted, sensor designers continue to look for ways to improve the sensors' functionality and effectiveness. In particular, it is continually desired to simplify the design and implementation of such sensors. Moreover, a need continually arises for a highly versatile yet low cost and easy to implement sensor design. In particular, a need exists for a sensor design scheme that is flexible enough to be easily implemented across a wide variety of applications yet powerful enough to provide accurate capacitance sensing, while at the same time remaining cost effective.

Accordingly, it is desirable to provide systems and methods for quickly, effectively and efficiently detecting a measurable capacitance. Moreover, it is desirable to create a scheme that can be implemented using readily available components, such as standard ICs, microcontrollers, and discrete components. Other desirable features and characteristics will become apparent from the subsequent detailed description and the appended claims, taken in conjunction with the accompanying drawings and the foregoing technical field and background.

BRIEF SUMMARY

Methods, systems and devices are described for detecting a measurable capacitance using charge transfer techniques that are implementable on many standard microcontrollers without requiring external, active analog components. According to various embodiments, a charge transfer process is performed two or more times. The charge transfer process comprises applying a pre-determined voltage to the measurable capacitance, and then allowing the measurable capacitance to share charge with a filter capacitance through a passive impedance that remains coupled to both the measurable capacitance and to the filter capacitance throughout the periods of applying of the pre-determined voltage and of allowing of the measurable capacitance to share charge. The value of the measurable capacitance can then be determined as a function of a representation of a charge on the filter capacitance and the number of times that the charge transfer process was performed. The number of times that the charge transfer process is executed can be pre-established or be based on the representation of the charge reaching some threshold. The representation of the charge on the filter capacitance can be obtained by a measuring step that produced a single-bit or multi-bit measurement. These steps can be repeated, and the results of the measuring step can be stored and/or filtered as appropriate.

Using the techniques described herein, a capacitance detection scheme may be conveniently implemented using readily available components, and can be particularly useful in sensing the position of a finger, stylus or other object with respect to a capacitive sensor implementing button, slider, cursor control, or user interface navigation function(s), or any other functions.

BRIEF DESCRIPTION OF THE DRAWINGS

Various aspects of the present invention will hereinafter be described in conjunction with the following drawing figures, wherein like numerals denote like elements, and:

FIGS. 4A-C are block diagrams of alternate embodiments of capacitance sensors;

DETAILED DESCRIPTION

Figure 1B:
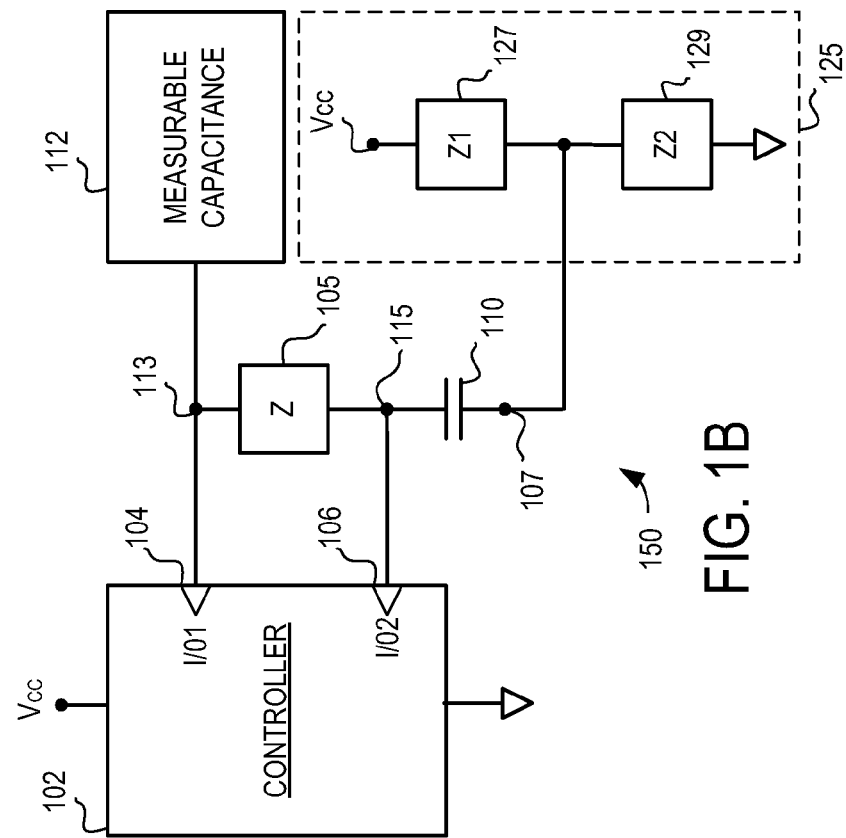
FIGS. 1A-D are block diagrams of exemplary implementations of capacitance sensors.

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

According to various exemplary embodiments, a capacitance detection and/or measurement circuit can be readily formulated using a passive electrical network and one or more switches. In a typical implementation, a charge transfer process is executed for two or more iterations in which a pre-determined voltage is applied to the measurable capacitance using one or more of the switches, and in which the measurable capacitance is allowed to share charge with a filter capacitance in the passive network. (The filter capacitance can also be referred to as an "integrating capacitance" or an "integrating filter.") With such a charge transfer process, a plurality of applications of the pre-determined voltage and the associated sharings of charge influence the voltage on the filter capacitance. The charge transfer process thus can be considered to roughly "integrate" charge onto the filter capacitance over multiple executions such that the "output" voltage of the filter capacitance is filtered. After two or more iterations of the charge transfer process (although some embodiments may use only one iteration), the representation of charge on the filter capacitance is read to determine the measurable capacitance. The representation of the charge on the filter capacitance can be a voltage on the filter capacitance, such as a voltage on a node of the circuit that indicates the voltage across the filter capacitance. The voltage on the filter capacitance can also be the voltage across the filter capacitance itself. The measuring of the representation of the charge on the filter capacitance can entail comparison with one or more thresholds to generate a single or multi-bit reading. The measuring can entail use of multi-bit analog-to-digital circuitry to generate a multi-bit measure of the representation of the charge.

Using these techniques, capacitive position sensors capable of detecting the presence or proximity of a finger, stylus or other object can be readily formulated. Additionally, various embodiments described herein can be readily implemented using only conventional switching mechanisms (e.g. those available through the I/Os of a control device) and passive components (e.g. one or more capacitors, resistors, inductors, and/or the like), without the need for additional active electronics that would add cost and complexity. As a result, the various schemes described herein may be conveniently yet reliably implemented in a variety of environments using readily-available and reasonably-priced components, as described more fully below.

The measurable capacitance is the effective capacitance of any signal source, electrode, or other electrical node having a capacitance detectable by a capacitive sensing system. For capacitive proximity sensors and other input devices accepting input from one or more fingers, styli, and/or other stimuli, measurable capacitance often represents the total effective capacitance from a sensing node to the local ground of the system ("absolute capacitance"). The total effective capacitance for input devices can be quite complex, involving capacitances, resistances, and inductances in series and in parallel as determined by the sensor design and the operating environment. In other cases, measurable capacitance may represent the total effective capacitance from a driving node to a sensing node ("transcapacitance"). This total effective capacitance can also be quite complex. However, in many cases the input can be modeled simply as a small variable capacitance in parallel with a fixed background capacitance.

In input devices using capacitance sensors, the measurable capacitance is often the variable capacitance exhibited by a sensing electrode of the capacitance sensor. The capacitance sensor may include multiple sensing electrodes, and each sensing electrode may be associated with a measurable capacitance. With an exemplary "absolute capacitance" sensing scheme, the measurable capacitance would include the capacitive coupling of the sensing electrode(s) to one or more input objects, such as any combination of finger(s), styli, or other object(s), that are close enough to the sensing electrode(s) to have detectable capacitive coupling with the sensing electrode(s). With an exemplary "transcapacitance" sensing scheme, the measurable capacitance would include the capacitive coupling of the sensing electrode(s) to one or more driving electrodes. This coupling to the input object(s) (for the "absolute capacitance" scheme) or between electrodes (for the "transcapacitance" scheme) changes as the electric field is affected by the input object(s). Thus, the value of the measurable capacitance can be used to ascertain information about the proximity, position, motion, or other positional information of the input object(s) for use by the capacitive input device or by any electronic system in communication with the capacitive input device.

The value of the pre-determined voltage applied to the measurable capacitance is often known, and often remains constant. For example, the pre-determined voltage can be a single convenient voltage, such as a power supply voltage, a battery voltage, a digital logic level, a resistance driven by a current source, a divided or amplified version of any of these voltages, and the like. However, the pre-determined voltage can also be unknown or variable, so long as the pre-determined voltage remains ratiometric with the measurement of the charge on the filter capacitance. For example, a capacitance sensing scheme can involve resetting the filter capacitance to a reset voltage, and also involve measuring a voltage across the filter capacitance by comparing the voltage (as relative to the reset voltage) on one side of the filter capacitance with a threshold voltage (also as relative to the reset voltage); with such a sensing scheme, the difference between the pre-determined voltage and the reset voltage, and the difference between the threshold voltage and the reset voltage, should remain roughly proportional to each other, on average over the execution(s) of the charge transfer process leading to the determination of the measurable capacitance. Thus, the threshold used to measure the change in voltage on the filter capacitance will be proportional to the change in voltage on the filter capacitance due to the charge shared from the measurable capacitance to the filter capacitance during the execution(s) of the charge transfer process for a determination of the measurable capacitance. In particular, where the pre-determined voltage is $V_{cc}$ and the reset voltage is GND, the threshold voltage can be ratiometric for a CMOS input threshold, for example $(1/2)*(V_{cc}-GND)$.

Figure 1A:
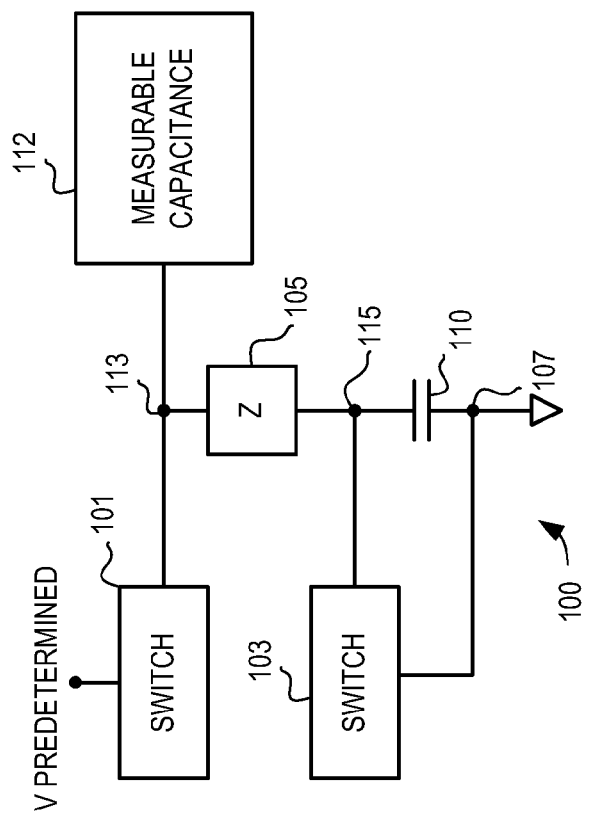

Turning now to the figures and with initial reference to FIG. 1A, an exemplary capacitance sensor 100 for determining a measurable capacitance 112 suitably includes a passive impedance 105 coupled with a filter capacitance 110. Although sensor 100 is driven using switches 101, 103, measurable capacitance 112, filter capacitance 110, and passive impedance 105 still form a passive electrical network that includes no active elements. Passive impedance 105 is provided by one or more non-active electronic components, such as any combination of capacitance(s), inductance(s), resistance(s), and the like. Capacitances, resistances, and inductances can be provided by any combination of capacitive, resistive, and inductive elements, respectively. Some elements exhibit more than one impedance property, such as having both resistive and inductive properties; these elements would thus provide both a resistance and an inductance to the network in which it is used. In various embodiments, passive impedance 105 is a resistance provided by a network or one or more resistors. Additionally, passive impedance 105 can include non-linear components such as diodes. Impedance 105 is generally designed to have an impedance that is large enough to prevent significant charge leaking into filter capacitance 110 during the applying of the pre-determined voltage to the measurable capacitance 112, as described more fully below. In various embodiments, impedance 105 may be a resistance on the order of a hundred kilo-ohms or more, although other embodiments may exhibit widely different impedance values.

Filter capacitance 110 is coupled to node 107 and to passive impedance 105 at node 115. Node 107 can be coupled to a suitable voltage (ground is shown in FIG. 1A although another reference voltage can be used). Filter capacitance 110 can be provided by one or more capacitors (such as a collection of any number of discrete capacitors) configured to accept charge transferred from measurable capacitance 112. Although the particular filter capacitance value selected will vary from embodiment to embodiment, the capacitance value of filter capacitance 110 will typically be an order of magnitude, and often several orders of magnitude, greater than the capacitance value of the measurable capacitance 112. For example, filter capacitance 110 may be designed on the order of several nanofarads or so, whereas measurable capacitance 112 could be on the order of picofarads. As one example that will be described in greater detail below, the filter capacitance 110 is selected such that the time constant of the RC circuit created by filter capacitance 110 and passive impedance 105 is greater than the duration of the pulses used to apply the pre-determined voltage to measurable capacitance 112.

The time constant of measurable capacitance 112 with passive impedance 105 is also preferably greater than the duration of the pre-determined voltage applied by the pulses to measurable capacitance 112. This is so that the charge added to filter capacitance 110 during the charge transfer process comes mostly from the charge stored on the measurable capacitance 112 and shared with filter capacitance 110, and less from any flow of current through passive impedance 105 during the applying of the pre-determined voltage. Since filter capacitance 110 is often orders of magnitude greater than measurable capacitance 112 in order to provide adequate capacitance-sensing resolution, it follows that its time constant with passive impedance 105 is also orders of magnitude greater than the duration of pre-determined voltage applied by the pulses. Thus, a relatively large time constant of the RC circuit allows the charge leakage to the filter capacitance 110 during the applying of the pre-determined voltage to be relatively small.

Sensor 100 also includes a switch 103 in parallel with filter capacitance 110 and coupled to nodes 115 and 107. Switch 103 can be closed to reset the charge on filter capacitance 110 before performing the charge transfer processes for a determination of a value of the measurable capacitance 112. In this case, closing switch 103 clears the charge on filter capacitance 110.

Other options for resetting filter capacitance 110 are readily available. For example, switch 103 can couple node 113 to a voltage such as ground (instead of nodes 107 and 115) such that closing switch 103 would reset the charge on filter capacitance 110 through passive impedance 105. Such a configuration may be implemented using a single digital I/O of a controller (such as shown in FIG. 4A). However, this configuration would reset with the time constant associated with passive impedance 105 and filter capacitance 110, and thus require a reset time greater than placing switch 103 in parallel with filter capacitance 110.

Operation of capacitance sensor 100 suitably involves a charge transfer process and a measurement process facilitated by the use of one or more switches 101, 103. Switches 101, 103 may be implemented with any type of discrete switches, buffered integrated circuits, field effect transistors and/or other switching constructs, to name just a few examples. Alternatively, switches 101, 103 can be implemented with internal logic/circuitry of a controller coupled to an output pin of the controller, as will be discussed in greater detail below. The output pin of the controller may also be coupled to internal logic/circuitry capable of providing input functionality, such that switches 101, 103 can be implemented using one or more I/Os of a controller.

The charge transfer process, which is typically repeated two or more times, suitably applies a pre-determined voltage (convenient voltages for the pre-determined voltage include a power supply voltage, a battery voltage, and a logic signal) to the measurable capacitance 112, and then allows measurable capacitance 112 to share charge with filter capacitance 110 as appropriate. In the example shown in FIG. 1A, closing switch 101 applies the pre-determined voltage to measurable capacitance 112 and opening switch 101 ceases the application of the pre-determined voltage to measurable capacitance 112. Circuit 100 illustrates a configuration where switch 101 is used to apply a voltage when it is closed and the application of the voltage ceases when switch 101 it is open. However, switches can be used to apply voltages when opened or closed, or used to apply a first voltage when open and a different voltage when closed. Thus, switch 101 is used to apply the pre-determined voltage in pulses or other waveforms that have a relatively short period in comparison to the RC time constant associated with impedance 105 and measurable capacitance 112 or filter capacitance 110 to help prevent excessive current leakage through impedance 105 during the applying of the pre-determined voltage. Leakage of charge through impedance 105 can be detrimental to sensor accuracy and/or resolution, since it is often difficult, if not practically impossible, to control or account for the charge leakage in measuring the representation of the charge on the filter capacitance 110 or determining a value of the measurable capacitance 112. Charge leakage through parasitic or stray impedances in addition to impedance 105 can also be detrimental to sensor performance, and this effect can be reduced by having a shorter application of the pre-determined voltage.

After applying the pre-determined voltage to measurable capacitance 112, the applying of the pre-determined voltage for that performance of the charge transfer process is ended by opening switch 101 and the measurable capacitance 112 is allowed to share charge with filter capacitance 110. During charge sharing, charge travels between measurable capacitance 112 and filter capacitance 110 through passive impedance 105. Passive impedance 105 remains coupled to the measurable capacitance 112 and the filter capacitance 110 during both the charging period (when the pre-determined voltage is applied to charge or discharge the measurable capacitance) and the allowing to share period (when the application of the pre-determined voltage is stopped). Although FIG. 1A shows a particular configuration for accomplishing this charge sharing, the sharing of charge through the passive impedance can be done a multitude of ways, and other circuits can be used without departing from the principles disclosed herein. For example, the electrical path from measurable capacitance 112 to ground in FIG. 1A (when the predetermined voltage is not applied and charge sharing is allowed) includes both impedance 105 and filter capacitance 110 in series. Since the impedance 105 and filter capacitance 110 are in series and the principle of the additivity of impedances applies, the relative positions of filter capacitance 110 and impedance 105 could be exchanged for this sensor 100 embodiment without altering the charge transfer process and the operation of the circuit.

To allow measurable capacitance 112 to share charge with the passive network, no action may be required other than to stop applying the pre-determined voltage and to pause (also "delay") for a time sufficient to allow charge to transfer between the measurable capacitance and the filter capacitance. This is true, for example, for the embodiment shown in FIG. 1A, where the pause time required for the charge to share between measurable capacitance 112 and filter capacitance 110 is determined by the time constant of the circuit including the measurable capacitance 112, the passive impedance 105, and the filter capacitance 110. In various embodiments, the pause time required may be relatively short (e.g. if the filter capacitance 110 is connected to the measurable capacitance 112 with a small resistance in series). In other embodiments, the delay required may be longer such that a lengthier pause time may be needed (e.g. if the filter capacitance 110 is connected to the measurable capacitance 112 with more significant passive impedance 105 in series). In other embodiments, allowing charge to transfer may involve actively actuating one or more switches associated with a controller to couple components external to the passive network, and/or taking other actions as appropriate. In such embodiments, the passive impedance 105 may be made smaller.

After performing one or more executions of the charge transfer process that includes the applying of the pre-determined voltage and the allowing of the measurable capacitance 112 to share charge with the filter capacitance 110, a representation of the charge on the filter capacitance 110 can be measured. The representation of the charge on filter capacitance 110 can be conveniently taken as the voltage at node 115 for the embodiment shown in FIG. 1A. The representation of the charge on filter capacitance 110 can also be taken as the voltage at node 113, but the voltage across passive impedance 105 must be accounted for in that case. However, the voltage across passive impedance 105 may be negligible for some embodiments and at certain times; if measurements are taken at these certain times for these embodiments, then the voltage at node 113 would then effectively be equivalent to the voltage at node 115. For example, if passive impedance 105 is a resistance, then negligible charge is stored on passive impedance 105; in addition, if measurable capacitance 112 and filter capacitance 110 have completed sharing, then insignificant current flows through passive impedance 105. In such a case, the voltage across passive impedance 105 is practically zero.

The measurement of the representation of the charge on filter capacitance 110 can be achieved by using a simple comparison with a threshold (such as by using a comparator to produce a single-bit measurement) or by more complex circuitry (such as by using a multi-bit ADC to produce a multi-bit measurement). When a threshold is used to produce a single-bit measurement, typically multiple measurements are taken to ascertain the number of executions of the charge transfer process needed for the representation of the charge to cross this threshold. This number of executions necessary can be used along with known values (e.g. the threshold, the value of filter capacitance 110, etc.) to determine a value of the measurable capacitance 112. When a multi-bit ADC is used to produce a higher resolution measurement, fewer measurements can be taken (one single measurement may be sufficient if the ADC provides sufficient resolution) and the number of executions before taking the measurement(s) can be pre-established. The multi-bit ADC measurement can be used along with known values and the pre-established number to determine the value of the measurable capacitance 112. Additional charge transfer processes can be performed after obtaining the measurement(s) for determining the value of the measurable capacitance 112 to bring the filter capacitance 110 to a reset state, or for convenience of design if the filter capacitance 110 is reset using a different method. These additional charge transfer processes may be especially useful for sensing multiple measurable capacitances.

As stated above, switches 101, 103 can be implemented with separate, discrete switches, or with the internal logic/circuitry coupled to an output or an input/output (I/O) of a controller. Turning now to FIG. 1B, a second exemplary capacitance sensor 150 is illustrated. The capacitance sensor 150 uses a controller 102 with I/Os 104 and 106 to provide switching functionality. I/O 104 can provide the switching associated with switch 101 of FIG. 1A. I/O 106 can provide switching functionality to reset the filter capacitance, but the effect differs from that associated with switch 103. In the case of the embodiment of FIG. 1B, I/O 106 is used to provide a reference voltage as does switch 103, but the filter capacitance 110 is reset to having a set amount of nonzero charge on filter capacitance 110 since node 107 is coupled to a voltage that typically can not be supplied by I/O 106. Digital I/Os of controllers are typically capable of switchably applying one or more logic values and/or a "high impedance" or "open circuit" value. The logic values may be any appropriate voltage or other signal. For example, a logic "high" or "1" value could correspond to a "high" voltage (e.g. $+V_{cc}$, which can be +5 volts for some controllers, or the like), and a logic "low" or "0" value could correspond to a comparatively "low" voltage (e.g. ground or 0V). Thus, the particular signals selected and applied using I/Os 104, 106 can vary significantly from implementation to implementation depending on the particular controller 102 selected. Thus, one advantage of these embodiments using controller I/Os is that a very flexible capacitance sensor 150 can be readily implemented using only passive components (e.g., passive resistance 105, filter capacitance 110) in conjunction with a conventional controller 102 such as a microcontroller, digital signal processor, microprocessor, programmable logic array, application specific integrated circuit and/or the like. A number of these controller products are readily available from various commercial sources including Microchip Technologies of Chandler, Ariz.; Freescale Semiconductor of Austin, Tex.; and Texas Instruments of Dallas, Tex., among others Further, in some embodiments, the controller 102 includes digital memory (e.g. static, dynamic or flash random access memory) that can be used to store data and instructions used to execute the various charge transfer processing routines for the various capacitance sensors contained herein. Because impedance 105 and filter capacitance 110 are statically connected, the only physical action that needs take place during sensor operation involves manipulation of signal levels at I/Os 104 and 106. Such manipulation may take place in response to software, firmware, configuration, or other instructions contained in controller 102.

In some embodiments, the filter capacitance 110 is coupled to an effectively constant voltage such as ground at node 107 such as shown in FIG. 1A. In other embodiments, the filter capacitance 110 is coupled to a varying voltage that improves the performance of the capacitance detection, such as shown in FIG. 1B. The exemplary embodiment shown in FIG. 1B includes such an optional compensation circuit 125 that compensates capacitance sensor 150 for fluctuations in power supply voltages, thereby providing improved resistance to power supply voltage noise effects. Compensation circuit 125 typically couples the side of filter capacitance 110 opposite the measurable capacitance 112 to either or both power supply rails (coupling to $+V_{cc}$ and ground is shown in FIG. 1B) associated with the implementation of capacitance sensor 150. Although FIG. 1B shows compensation circuit 125 compensating only one filter capacitance 110, the same compensation circuit can be coupled to multiple filter capacitance 110 at node 107. Thus, compensation circuit 125 can easily be used to compensate sensors with multiple sensing channels and multiple filter capacitances. With the configuration shown in FIG. 1B, fluctuations in the supply rails (also "supply voltage ripple") induce similar fluctuations in the voltage at node 107, and therefore can be used to compensate for fluctuations in thresholds associated with controller 102 induced by the same supply voltage ripple.

The exemplary compensation circuit 125 shown in FIG. 1B, includes two impedances 127 and 129 configured in an impedance divider arrangement between the two supply voltages of $+V_{cc}$ and ground. An impedance divider is composed of two passive impedances in series, where each passive impedance is coupled to at least two nodes. One of these nodes is common to both impedances ("a common node" to which both impedances connect.) The common node serves as the output of the impedance divider. The output of the impedance divider is a function of the voltages and/or currents applied at the "unshared" nodes (the nodes of the two impedances that are not the common node) over time. A simple example of an impedance divider is a voltage divider composed of two capacitances or two resistances. More complex impedance dividers may have unmatched capacitances, resistances, or inductances in series or in parallel. An impedance may also have any combination of capacitive, resistive, and inductive characteristics.

For compensation circuit 125 shown in FIG 1B, the impedance divider can be a voltage divider formed from two resistances or two capacitances coupled to $+V_{cc}$ and ground. The impedance divider of circuit 125 has a "common node" coupled to the filter capacitance 110 at node 107. Resistive versions of impedances 127 and 129 can comprise resistors to form a resistive divider network, and capacitive versions of impedances 127 and 129 can comprise capacitors to form a capacitive divider network. By selecting appropriate values for impedances 127 and 129, filter capacitance 110 can be biased toward any voltage that lies between the two supply voltages. Moreover, variations in supply voltage will be automatically compensated by the compensation circuit 125. This is because such a voltage divider provides a voltage that reflects the fluctuations in power supply voltage without significant lag. Although advantageous for some embodiments, the use of a compensation circuit 125 may not be desirable in all embodiments.

Figure 1C:
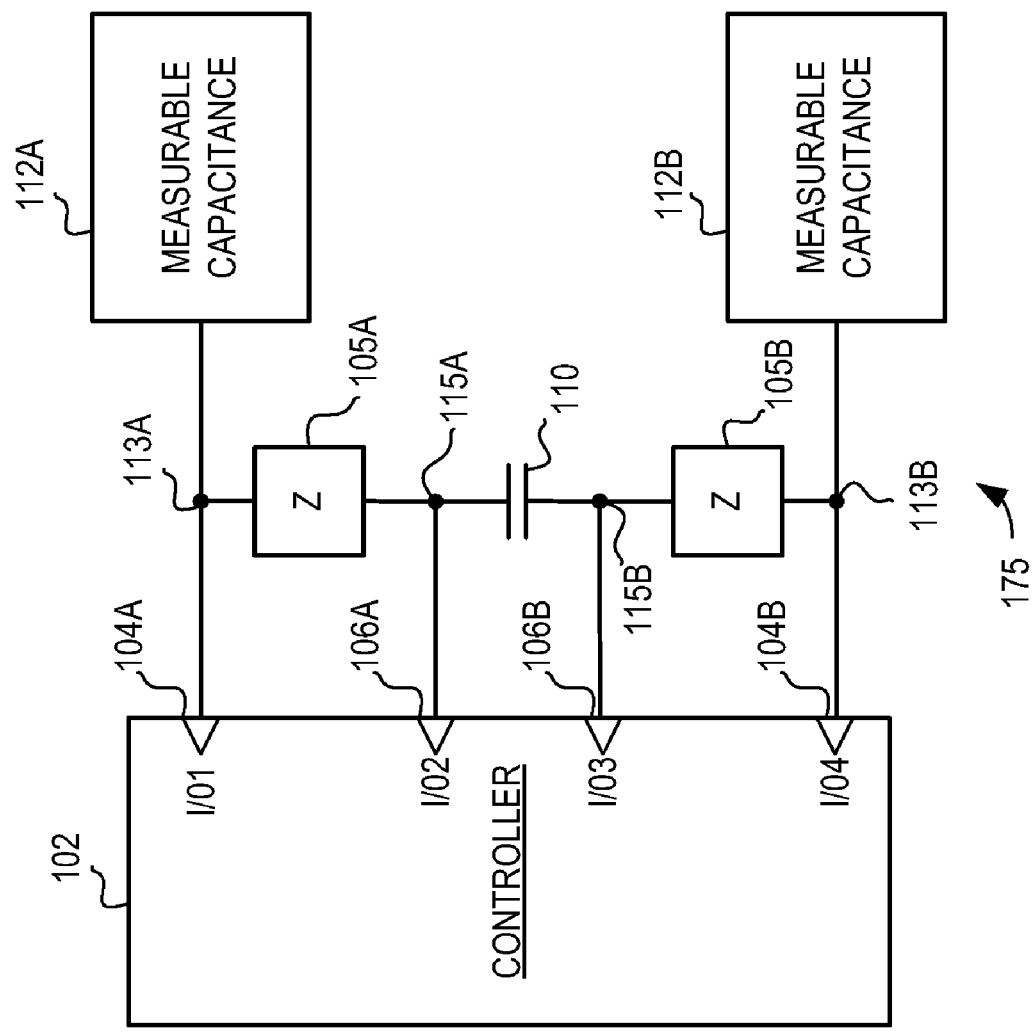
Figure 1D:
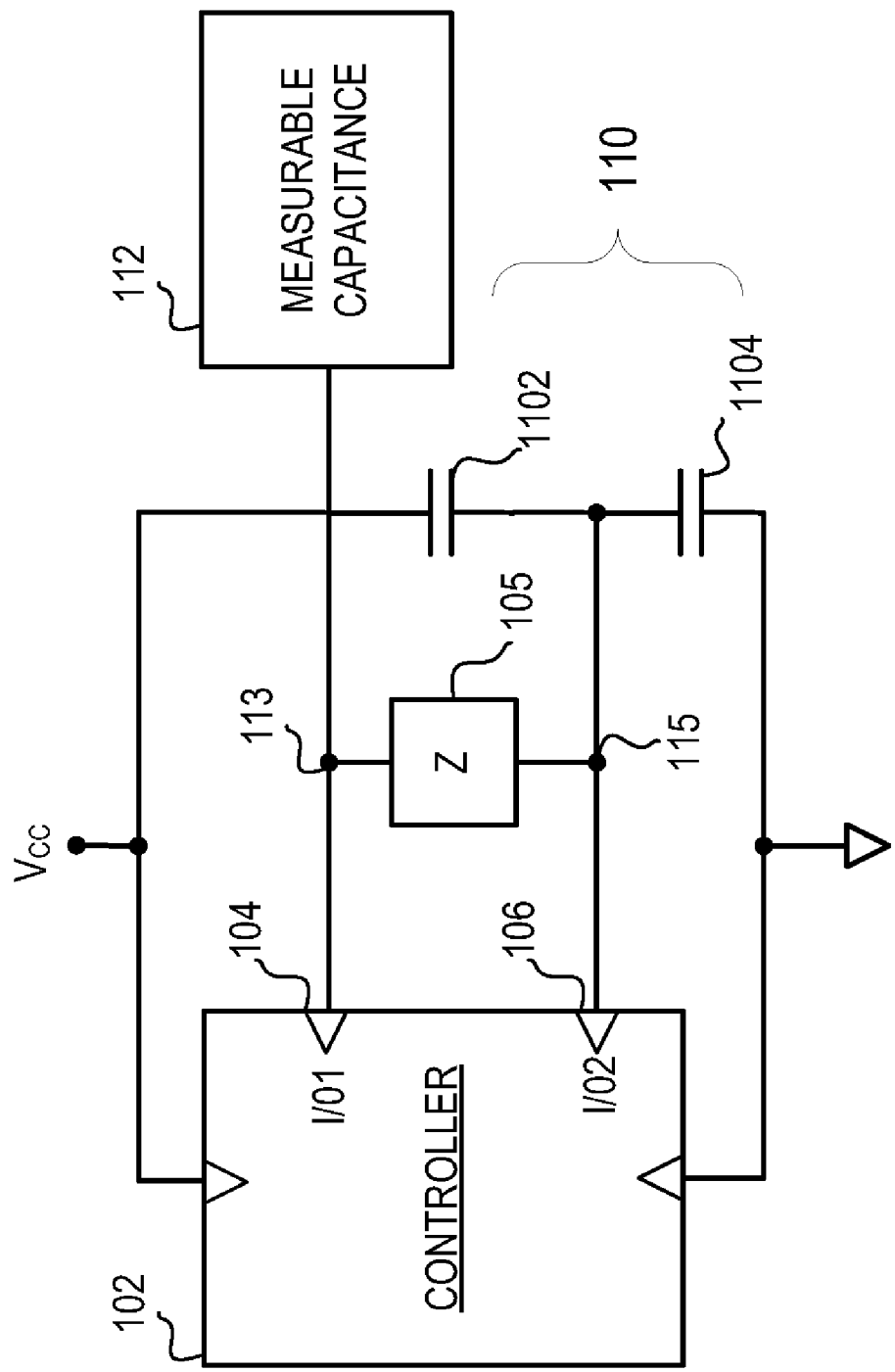

FIG. 1D shows another sensor circuit 195 that demonstrates another method of coupling the filter capacitance to a varying voltage that improves the performance of the capacitance detection. In circuit 195, voltage compensation is achieved by using a combination filter capacitance 110 formed from a capacitive impedance divider statically coupled to both power supply rails. This combination filter capacitance 110 includes a first filter capacitance 1102 statically coupled to a first power supply rail ($+V_{cc}$ is shown in FIG. 1D) and a second filter capacitance 1104 statically coupled to the other power supply rail (GND is shown in FIG. 1D). The first and second filter capacitances 1102 and 1104 are coupled to each other at their common node, which is also node 115. Node 115 is further coupled to passive impedance 105 and I/O 106. The passive impedance 105 is also coupled to I/O 104 and measurable capacitance 112 at node 113. Overall, the configuration of circuit 195 is very similar to the configuration of circuit 150 (FIG. 1B) without compensation circuit 125; however, circuit 195 has a split filter capacitance that couples to both power supply rails.

The operation of circuit 195 can be very similar to the operation of circuit 150. I/O 104 can apply the predetermined voltage to measurable capacitance 112 by providing a logic value (e.g. a logic "high"). I/O 104 can then be held at high impedance to allow charge sharing between measurable capacitance 112 and both capacitances 1102-1104 of combination filter capacitance 110. I/O 106 (or some other circuitry) can be used to measure the voltage at node 115, which is still representative of the charge on combination filter capacitance 110 by being representative of the total charge on capacitances 1102-1104. I/O 106 can provide a reset signal (e.g. a logic "low") to reset the charge on both capacitances 1102-1104 after the appropriate number of charge transfer processes has been performed. With the configuration shown in FIG. 1D, fluctuations in the supply rails induce similar fluctuations in the voltages to which combination filter capacitance 110 is referenced ($+V_{cc}$ for capacitance 1102 and GND for capacitance 1104). Therefore, the embodiment of circuit 195 can compensate for fluctuations in thresholds associated with controller 102 that are induced by the same supply voltage ripple.

Since the circuit 195 achieves compensation by using the filter capacitance, it has the advantage over compensation circuit 125 of fewer components when only one or two filter capacitances are needed by the sensor. In many cases, the compensation illustrated by circuit 195 can be shared by multiple sensing channels that share the same filter capacitance (e.g. circuit 440 of FIG. 4C, discussed below). However, the split-filter-capacitance method illustrated by FIG. 1D is more difficult to share across multiple sensing channels than compensation circuit 125 of FIG. 1B, since sharing the compensation would share the filter capacitance.

Figure 2A:
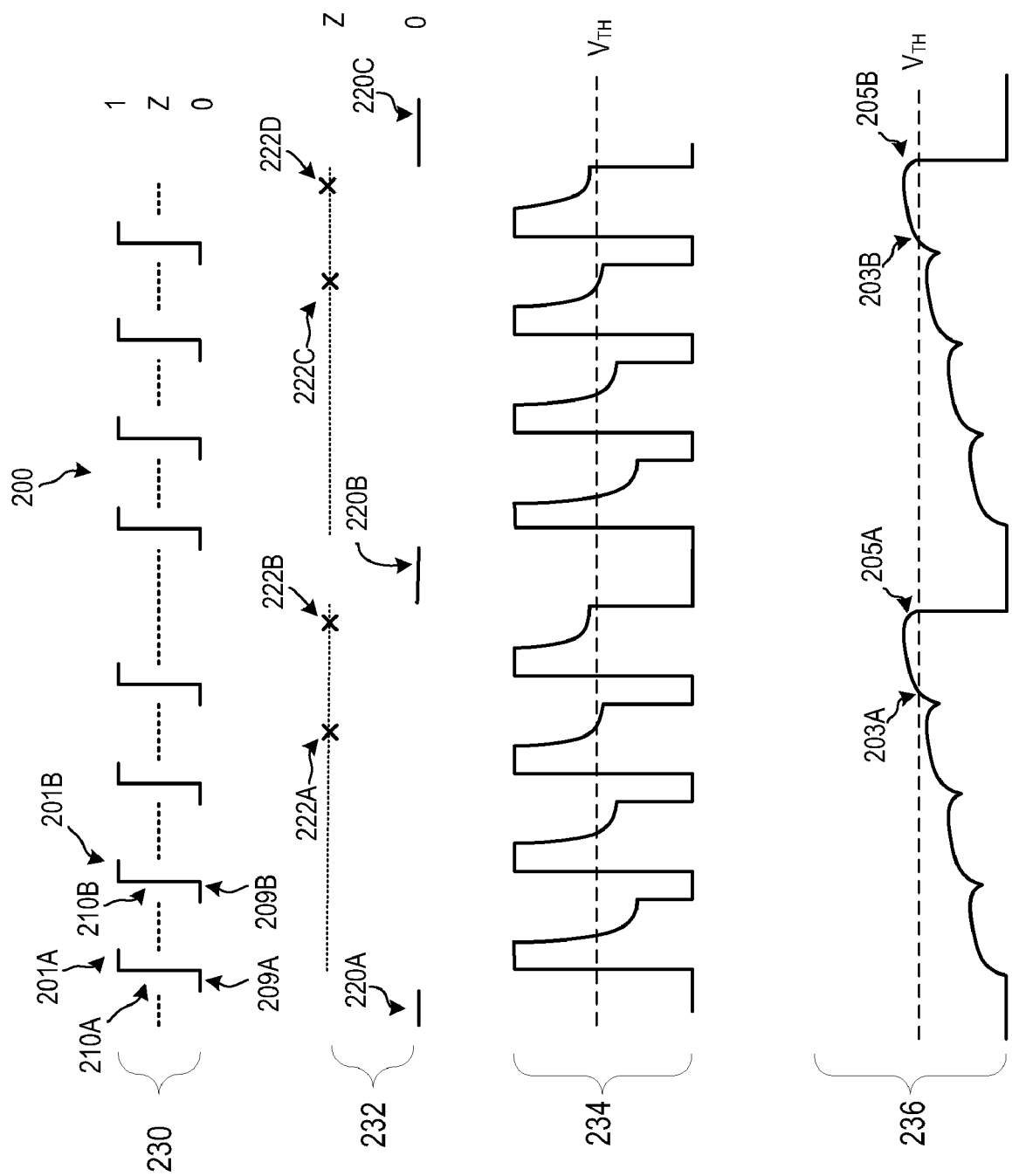
FIG. 2A-B are timing diagrams showing exemplary techniques for operating a capacitance sensor such as that shown in FIG. 1B.

With reference to FIG. 2A, an exemplary timing scheme 200 is shown that would be suitable for operating capacitance sensor 150 of FIG. 1B. Specifically, FIG. 2A illustrates the voltages associated with I/Os 104 and 106, and at nodes 113 and 115. Trace 230 shows an exemplary set of charging voltage pulses 210 that can be provided to measurable capacitance 112 using I/O 104. The charging voltage pulses 210 include both logic low (0) output portions 209 and logic high (1) output portions 201. In the embodiment shown in FIGS. 1B, 2A, the logic high output portions apply the pre-determined voltage to the measurable capacitance 112 via node 113 such that the pre-determined voltage is the voltage associated with a logic high output (which is $+V_{cc}$ for a typical controller 102). Thus, the pre-determined voltage is applied using the appropriate switch (e.g. via circuitry internal to controller 102 that produces the appropriate signal output on I/O 104 in FIG. 1B). The logic high portions 201 of charging voltage pulses 210 are generally selected to have a period shorter than the response time of the RC circuit that includes impedance 105 and filter capacitance 110 such that any charge leakage to the filter capacitance 110 during the applying of the pre-determined voltage will be negligible.

In the embodiment shown in FIG. 2A, the charging voltage pulses 210 also include relatively brief logic low output portions 209 (which is GND for a typical controller 102, although other controllers may output other logic values). Logic low output portions 209 provide an "opposing" voltage that precedes the logic high output portions 201 that apply the pre-determined voltage. The "opposing" voltage has a magnitude opposite that of the pre-determined voltage and helps compensate for current leaking through impedance 105 during the charge transfer process by "current cancelling." The durations of the logic output portions 209 are chosen so the amount of parasitic charge removed by driving the opposing voltage is mostly equal to the amount of parasitic charge added by applying the pre-determined voltage. In the charging pulses 210 of FIG. 2A, "opposing" voltage is applied for about the same duration as the application of the pre-determined voltage. Such "current cancelling" is an optional feature that is not required in all embodiments.

Trace 232 of FIG. 2A illustrates an exemplary set of reset signals 220 that can be provided by I/O 106. These reset signals 220 can provide a reset voltage to the filter capacitance 110 at node 115 to reset the charge on the filter capacitance 110. The reset signals 220 are provided to node 115 through a switch (e.g. via circuitry internal to controller 102 that produces the appropriate signal output on I/O 106 in FIG. 1B). In the illustrated example of FIG. 2A, the reset signals 220 comprise low voltage outputs that reset the charge contained on filter capacitance 110. This reset signal may be provided periodically, aperiodically, or otherwise, and/or may not be provided at all in some embodiments, as described more fully below. For example, a particular reset signal 220 can be applied to node 115 after the voltage at node 115 (which is a representation of the charge on the filter capacitance 110) passes a threshold; this is shown in timing chart 200 with the reset signals 220A-C being provided after the voltage at node 115 (shown by trace 236) passes a threshold voltage $V_{TH}$.

Between the applications of the charging voltage pulses 210, the measurable capacitance 112 is allowed to share charge with filter capacitance 110 by holding I/O 104 to a high impedance state (Z). The embodiment of timing chart 200 shows the pre-determined voltage being applied by logic highs, such that the measurable capacitance 112 charges during the applying of the pre-determined voltage and discharges through impedance 105 to filter capacitance 110 during charge sharing. FIG. 2A illustrates an exemplary voltage trace 234 of the voltage at node 113 that shows the result of each charging voltage pulse 210 on the voltage at node 113. Specifically, voltage trace 234 illustrates how each opposing voltage portion 209 of a charging pulse 210 drives the voltage on measurable capacitance 112 to the opposing voltage (which is shown as ground in FIG. 2A), how each pre-determined voltage portion 201 of a charging pulse drives the voltage on measurable capacitance 112 to the pre-determined voltage (which is shown as $+V_{cc}$ in FIG. 2A), and how charge sharing between the measurable capacitance 112 and filter capacitance 110 brings the voltages on the measurable capacitance 112 (at node 113) and filter capacitance 110 (at node 115) close to each other. Thus, voltage trace 234 shows the results as each charging voltage pulse 210 removes charge by applying ground to node 113 and charges the measurable capacitance 112 by applying $+V_{cc}$, and the results as the measurable capacitance 112 shares charge with the filter capacitance 110.

The resulting voltage on filter capacitance 110 (i.e. the voltage at node 115 for the embodiment shown in FIGS. 1B, 2A), is illustrated in FIG. 2A as voltage trace 236. Voltage trace 236 exhibits slight drops and rises in response to the driving of the opposing voltage and the pre-determined voltage in "current cancelling." Voltage trace 236 also shows the gradual increase in voltage at node 115 as the filter capacitance 110 charge shares with measurable capacitance 112 over performances of the charge transfer process.

Voltage traces 234 and 236 both show how the measurable capacitance 112 is charged relatively quickly with each application of the pre-determined voltage, while the relatively large time constant of the measurable capacitance 112 or filter capacitance 110 and passive impedance 105 that forms the passive network causes a relatively slower discharging of the filter capacitance 110. Typically, the sharing period is sized to be long enough for the voltages at node 113 and 115 to roughly equalize, such that any current still flowing between measurable capacitance 112 and filter capacitance 110 is negligible.

Several different methods can be used to determine the measurable capacitance 112 from the voltage at the filter capacitance 110. In one method, the voltage at node 115 is compared to an appropriate threshold voltage ($V_{TH}$) to provide a single bit analog-to-digital (A/D) conversion of the voltage on the filter capacitance 110. (As discussed earlier, the voltage at node 113 may also be used as a representation of the charge on filter capacitance 110, and can be measured using I/O 104. However, for this example, the voltage at node 115 is used.) This voltage comparison can be performed by a comparator coupled to node 115. For example, the controller 102 of FIG. 1B can include an analog voltage comparator function coupled to I/O 106. Alternatively, the comparator function can be performed by the input circuitry of an ordinary digital I/O pin 106, in which case the threshold $V_{TH}$ is typically the predetermined threshold of the digital input buffer (such as a CMOS threshold). Thus I/O 106 can be used to compare the voltage at node 115 to the threshold voltage and thus obtain a representation of the charge on filter capacitance 110. In one embodiment, this threshold voltage is roughly equivalent to the midpoint between the high and low logic values.

The embodiment shown in FIGS. 1B, 2A can use this comparator-type method, and the timing chart 200 illustrates this method with the dashed $V_{TH}$ lines indicating a threshold voltage level $V_{TH}$ and the points 222 indicating I/O 106 reading times. As shown in trace 236, the charge transfer process of applying charging pulses 210 to the measurable capacitance 112 and allowing charge sharing by the measurable capacitance 112 with filter capacitance 110 repeats until the voltage at node 115 is detected to exceed the threshold voltage $V_{TH}$. I/O 106 of controller 102 has input functionality, and can be read to measure the voltage at node 115 by comparing it with an input threshold of I/O 106. This measuring and ascertaining of the voltage on filter capacitance 110 can occur for some or all performances of the charge transfer process. Timing chart 200 of FIG. 2A shows the reading of I/O 106 at points 222A-D, which include only some of the performances of the charge transfer process.

After the voltage at node 115 exceeds the threshold (indicated by points 203A,B on trace 236, and after this crossing of the threshold is detected by the system through reading of I/O 106 at points 222B,D), reset signals 220B,C are applied to node 115 to reset the charge on filter capacitance 110. Although sometimes only one performance of the charge transfer process is needed to cross the threshold, typically tens or hundreds or more performances of the charge transfer process are involved. Timing chart 200 shows the threshold being passed after only four performances of the charge transfer process for convenience of explanation. By ascertaining the number of charge transfer processes performed until the voltage on filter capacitance 110 (i.e. the voltage at node 115 for the embodiment shown in FIGS. 1B, 2A) exceeds the threshold voltage $V_{TH}$, a value of the measurable capacitance 112 can be effectively determined. That is, the number of charge/discharge cycles of measurable capacitance 112 performed to produce a known amount of charge on capacitance 110 (as indicated by the voltage at node 115 passing a known voltage threshold $V_{TH}$) can be effectively correlated to the actual capacitance of measurable capacitance 112.

This comparator-type method can also be implemented with any combination of circuitry internal and/or external to controller 102 as appropriate. Many variations of this comparator-type method also exist and are contemplated. For example, multiple thresholds can be provided using a multitude of reference voltages for one or more comparators, using a specialized input of the controller 102, or using an input of the controller having hysteresis (e.g. a Schmitt trigger type input). If multiple thresholds are used, the charge transfer process can also change as different thresholds are reached. For example, the charge transfer process can be configured to transfer relatively larger amounts of charge to reach coarser thresholds if the thresholds are not evenly spaced, or first thresholds if there is a multitude of thresholds that all must be crossed. The number of performances of each type of charge transfer process needed to cross the last threshold crossed can be used to determine the value of the measurable capacitance 112; additional information concerning the crossing of other thresholds can also be used to refine the determination.

In other embodiments, alternative methods of determining the value of the measurable capacitance are used. In another method, a direct multi-bit measurement of the voltage at node 115 is taken and used to determine the capacitance of the measurable capacitance 112. For example, the controller 102 can include a high resolution analog-to-digital function that allows more accurate measurement of voltage 115. In such embodiments, the charge transfer process can execute for a pre-set number of times, after which a multi-bit value of the voltage at node 115 is measured. After the measurement and the pre-set number of times, the charge on filter capacitance 110 can be reset for the next cycle of executions of the charge transfer processes.

The embodiment shown by FIGS. 1B, 2A can use this multi-bit method, and the timing chart 200 of FIG. 2A illustrates this. Ignoring the voltage threshold $V_{TH}$ lines and the reading points 222A,C, voltage trace 236 shows four as the pre-established number of performances of the charge transfer process and illustrates the measuring of the voltage at node 115 after four executions of the charge transfer process at points 205A-B. As in the comparator-type method, the multi-bit measurement can be taken using any combination of circuitry internal and/or external to controller 102. For example, I/O 106 can be used directly if it has multi-bit input functionality. Alternatively, another input of 102, another controller with ADC capability, or an external ADC or some other circuitry can be coupled to controller 102 and used to measure. The value of measurable capacitance 112 is then determined from the measured voltage on the filter capacitance 110 (the voltage at node 115 for the embodiment shown in FIG. 1B).

Many variations of this ADC-type method exist and are contemplated. For example, multi-bit measurements can be taken at multiple times in a set of charge transfer processes performed between resets of the filter capacitance 110. As another example, the number of executions of the charge transfer process does not have to be pre-set, such that both the number of charge transfer processes performed and the voltage at node 115 are tracked to produce a value of the measurable capacitance 112.

Figure 2B:
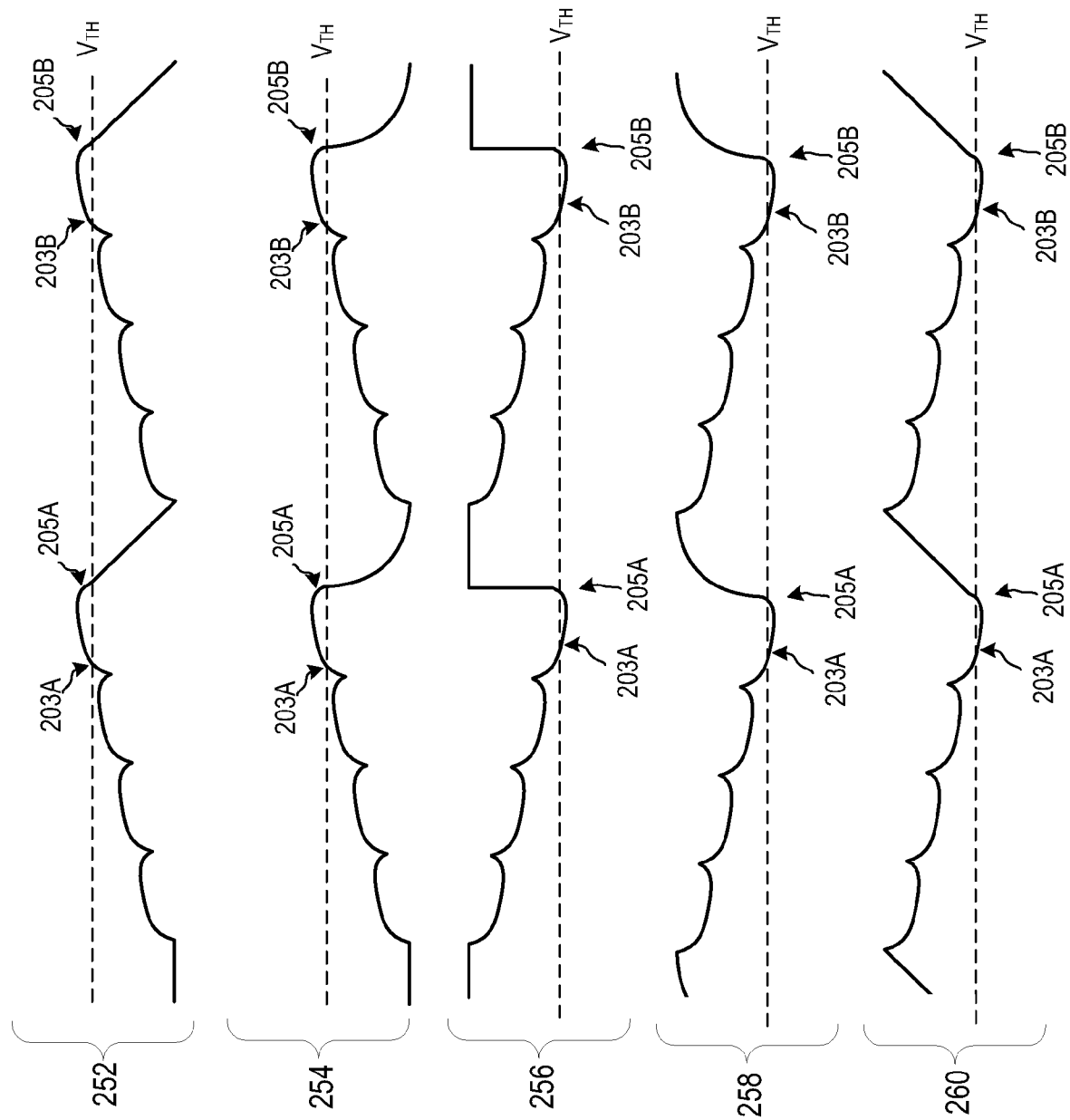

Other methods can be used to determine the measurable capacitance 112 from the voltage at the filter capacitance 110, and FIG. 2B illustrates some example voltage traces on filter capacitance 110 (e.g. voltage at node 115) that may result. For example, one method entails performing the charge transfer process for a pre-set number of times, and then drawing charge from filter capacitance 110 using a current source (trace 252) or a discharge circuit with a known time response, such as a first order response (trace 254). The time needed for the charge on filter capacitance 110 to fall to a known value such as zero can be monitored and quantized to produce a single or a multi-bit measurement of the representation of the charge on the filter capacitance 110. This measurement can be used along with the pre-set number in determining the value of measurable capacitance 112. With such methods, the filter capacitance 110 can be left at the known value after measurement, such that no separate reset signal needs to be applied.

Many changes could be made to the basic structures and operations shown in FIGS. 1A-B and 2. The timing scheme 200 shown in FIG. 2A assumes a "positive" transfer of charge from measurable capacitance 112 to filter capacitance 110, for example, whereas equivalent embodiments could be based upon sharing of charge in the opposite direction. (That is, charge could be placed on filter capacitance 110 during reset, and this charge is removed and drawn through impedance 105 to measurable capacitance 112 during sharing. This can be done by applying a high reset voltage to node 115, and then using charging pulses 210 that apply a low pre-determined voltage to measurable capacitance 112 such that sharing between the measurable capacitance 112 and filter capacitance 110 discharges filter capacitance 110 and lowers the voltage at node 115.) Traces 256, 258, and 260 show exemplary voltages on filter capacitance that may be observed in embodiments using such "negative" transfers of charge. Trace 256 shows the response of an exemplary system when negligible delay exists when the filter capacitance is reset; such a response may be observed in a system that is reset directly with negligible coupling resistance. Trace 258 shows the response of an exemplary system when a time response similar to a first-order RC or L/R response applies when the filter capacitance is reset; such a response may be observed in a system that is reset using an RC or L/R circuit. Trace 260 shows the response of an exemplary system with a time response that is roughly linear when the filter capacitance is reset; such a response may be observed in a system that is reset by driving a current source for an amount of time. Various other techniques for determining the measurable capacitance 112 as a function of a representation of a charge on the filter capacitance 110 and the number of times that the charge transfer process was performed are described herein.

Figure 3A:
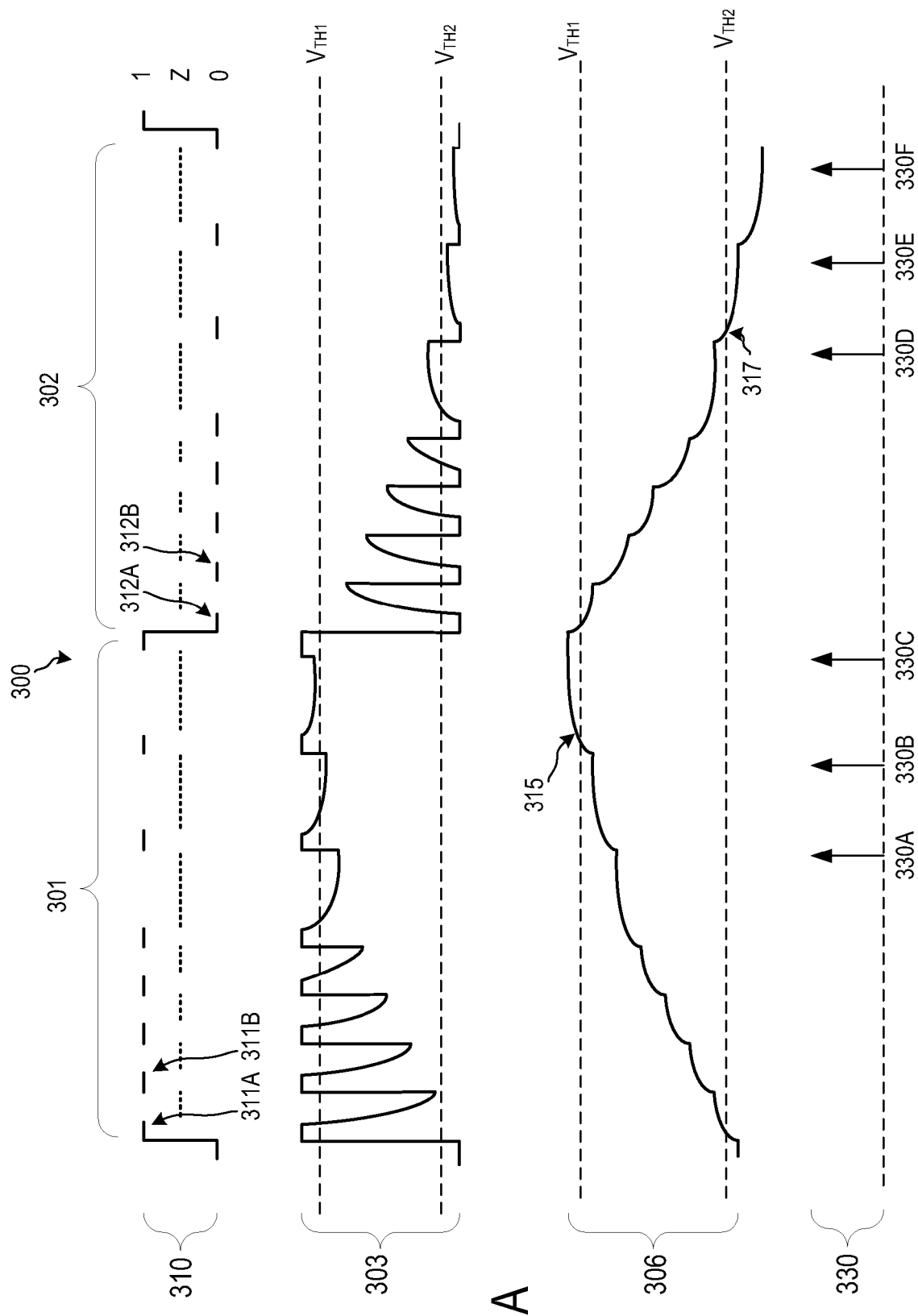
FIG. 3A-B are timing diagrams showing an alternate technique for operating a capacitance sensor such as that shown in FIG. 1B.

For example, numerous equivalent techniques can be formulated. With reference to FIG. 3A, an alternate timing scheme 300 illustrates the circuit shown in FIG. 1B practicing an "oscillator" type method with two different pre-determined voltages to charge measurable capacitance 112 and two threshold voltages to determine measurable capacitance 112. Voltage trace 310 of timing scheme 300 applies charging pulses 310 in groups of opposing "positive" charge pulses 311 and "negative" charge pulses 312. Specifically, timing scheme 300 shows a first set of charge transfer processes that apply "positive" charge pulses 311 (thus applying a high pre-determined voltage) during a first time period 301; the timing scheme 300 also shows another set of charge transfer processes that apply "negative" charge pulses 312 (thus applying a low pre-determined voltage) during a second time period 302. FIG. 3A illustrates an exemplary voltage trace 303 of the resulting voltage at node 113. Voltage trace 303 illustrates the result of the sets of charging pulses 311, 312 on the voltage at node 113. Specifically, voltage trace 303 illustrates how each higher charging voltage pulse 311 charges measurable capacitance 112 and how the charge thus placed on measurable capacitance 112 is discharged when shared with the filter capacitance 110. Voltage trace 303 additionally illustrates how each lower charging voltage pulse 312 discharges measurable capacitance 112 and how measurable capacitance thus discharges filter capacitance 110 when allowed to share with the filter capacitance 110. The resulting voltage on filter capacitance 110 (i.e. the voltage at node 115 for the embodiment shown by FIGS. 1B, 3A), is illustrated as voltage trace 306. Although timing chart 300 shows the first set of charge transfer process as roughly mirroring that of the other set of charge transfer process, the two charge transfer processes do not need to have such similarity. For example, durations, frequencies, and/or voltage magnitudes can differ.

In this example, pulses 311 of "positive" charge are applied to measurable capacitance 112 during a first period of time 301, such that allowing the measurable capacitance 112 to share charge with the filter capacitance 110 charges the filter capacitance 110 at node 115. This causes the voltage on node 115 to rise. At time 315, the voltage at node 115 passes a first threshold voltage $V_{TH1}$, which is detected by the measurement occurring at the time indicated by point 330C. Shortly thereafter, pulses 312 of "negative" charge are applied to measurable capacitance 112 during the second time period 302, such that allowing the measurable capacitance 112 to share charge with the filter capacitance 110 discharges the filter capacitance 110. This causes the voltage to drop on node 115. At time 317 the voltage at node 117 passes a second threshold voltage $V_{TH2}$, which is detected by the measurement occurring at the time indicated by point 330E. In the embodiment shown in FIGS. 1B, 3A, both crossings of the threshold voltages $V_{TH1}$ and $V_{TH2}$ are measured and can be used along with the number of times the charge transfer process was performed to determine the value of measurable capacitance 112.

After periods 301 and 302, additional periods with "positive" charging and "negative" charging can occur where filter capacitance 110 is charged during one time period and discharged during another. With its cycles of both "positive" and "negative" charging, this oscillator embodiment does not need a separate reset signal as described above. This is because the amplitude and rate of change (amount of voltage change per performance of the charge transfer process) of the voltage waveform that results on the filter capacitance 110 is independent of the starting voltage on the filter capacitance 110 (assuming no components saturate and power supply rails are not reached) and are indicative of the value of the measurable capacitance 112 used in the charge transfer process. A larger value of measurable capacitance 112 means that the voltage thresholds $V_{TH1}$ and $V_{TH2}$ will be crossed with fewer performances of the charge transfer process, and a smaller value of measurable capacitance 112 means that the voltage thresholds $V_{TH1}$ and $V_{TH2}$ will be crossed with more performances of the charge transfer process. Therefore, it is not required that the filter capacitance 110 be reset or otherwise placed at a known state after a threshold is crossed and before beginning a set of charge transfer processes.

Similarly, the cycles of both "positive" and "negative" charging also mean that additional charge transfer processes can be performed after a threshold voltage is crossed without detrimentally affecting the sensor's performance, even if no reset of the filter capacitance occurs. Taking this into account, sensors with multiple sensing channels driven in parallel (i.e. by simultaneous charge transfer cycles) would preferably "overrun" sensing channels, and continue performing additional charge transfer cycles as needed past the crossings of their respective thresholds. Sensors with multiple sensing channels in physical proximity to each other preferably experience similar electrical states as each other to minimize noise. For example, the effects of any parasitic coupling between sensing electrodes of different sensing channels is reduced when the sensing electrodes exhibit similar voltages. If one of these sensing electrodes are driven by a charge transfer process while another is not, then they can "cross-talk" and degrade sensor performance; however, if both of these sensing electrodes are driven to similar voltages (say, by similar charge transfer processes operating simultaneously), then the "cross-talk" is reduced. Driving multiple sensing electrodes to similar voltages also helps to shield the sensing electrodes from external disturbances. Therefore, it is advantageous in such systems to drive these channels to the same voltage by performing charge transfer processes on all or none of the channels, no matter what the relative timing of their threshold crossings.

Therefore, even though the circuits of the present invention can be driven such that the charge transfer processes end based on when the applicable threshold voltage (e.g. $V_{TH1}$, $V_{TH2}$ in the case of the embodiment of FIG. 3A) is crossed, that mode of operation may not be desirable in many embodiments with multiple sensing channels. Instead, it may be preferable to continue performing charge transfer processes after the crossing of the applicable threshold voltage in a multiple sensing channel system where the channels are operated simultaneously or in parallel. The total number of charge transfer processes performed may then be based on when the last-in-time filter capacitance of the multiple sensing channels crosses its threshold. The total number of charge transfer processes can also be pre-selected to be a large enough number that (at least in most cases) the last-in-time filter capacitance of the multiple sensing channels would have crossed its threshold.

Figure 3B:
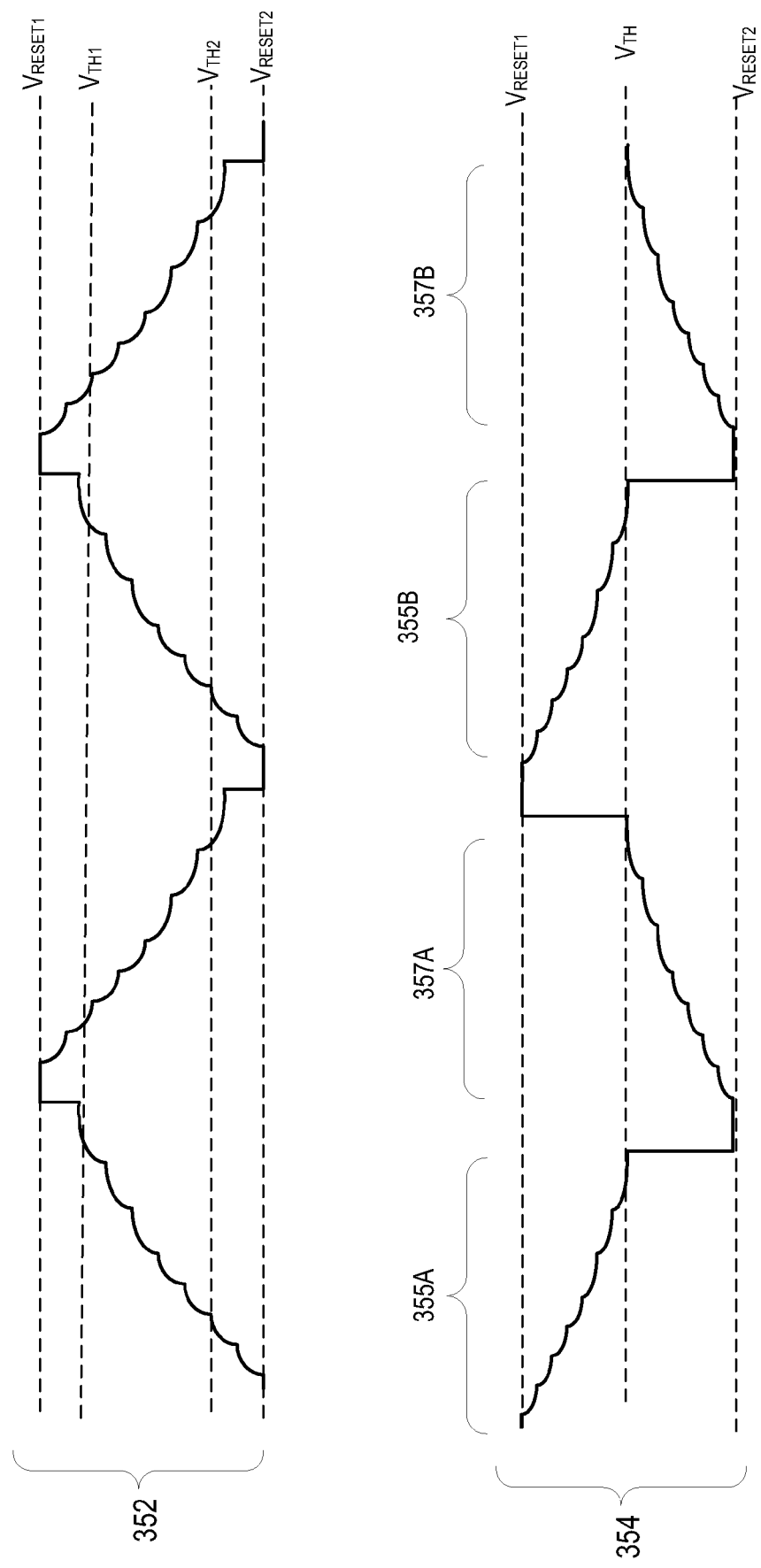

However, it should be noted that in some embodiments a reset signal may be applied between sets of opposing charge pulses. For example, the filter capacitance 110 can be reset-high to produce a high voltage at node 115 after the voltage at node 115 passes higher threshold $V_{TH1}$, and the filter capacitance 110 can be reset-low to product a low voltage at node 115 after the voltage at node 115 passes lower threshold voltage $V_{TH2}$. Trace 352 of FIG. 3B illustrates the voltage on filter capacitance 110 for an exemplary system using two reset voltages and two threshold voltages. Although trace 352 shows no "overrunning" charge transfer processes past thresholds $V_{TH1}$ or $V_{TH2}$, other embodiments may have such "overrunning" processes.

Applying reset signals can also enable variations of the "oscillator" embodiment. For example, when two types of reset signals are used to reset-high and reset-low, an "oscillator" can be implemented using only one threshold voltage $V_{TH}$. Trace 354 of FIG. 3B illustrates the voltage on filter capacitance 110 for an exemplary system using two reset voltages and one threshold voltage. After a period 355 of charge transfer processes with "negative" charging pulses 311 sufficient to decrease the voltage on filter capacitance 110 past the threshold voltage $V_{TH}$, a reset-low signal can be applied to set the voltage on filter capacitance 110 to a low-reset voltage lower than $V_{TH}$. Then, a period 357 of charge transfer processes with "positive" charging pulses 312 can be applied until the voltage on filter capacitance 110 is detect to pass the threshold voltage $V_{TH}$ again, although this time crossing $V_{TH}$ in the opposing manner. Although trace 354 shows no "overrunning" charge transfer processes past thresholds $V_{TH1}$ or $V_{TH2}$, other embodiments may have such "overrunning" processes.

Returning to the example show by FIGS. 1B, 3A, the number of performances of the charge transfer process during time period 301 and the number of performances of the other charge transfer process during time period 302 can be determined in any manner. In various embodiments, the I/O 106 coupled to node 115 incorporates an input having hysteresis, such as Schmitt trigger feature, that provides the two threshold/comparison voltages $V_{TH1}$ and $V_{TH2}$. I/O 106 can thus be used to read the voltage at node 115 at times indicated by points 330 of FIG. 3A. As the voltage on filter capacitance 110 is sensed to have passed higher threshold $V_{TH1}$ (e.g. at point 330C) in such embodiments, a set of charge transfer process can be applied in the opposing direction to reduce the voltage on filter capacitance 110. Similarly, as the voltage on filter capacitance 110 is sensed to have passed lower threshold $V_{TH2}$ (e.g. at point 330E) another set of charge transfer process can be applied in the opposing direction to increase the voltage on filter capacitance 110. As shown by trace 306, the sensing scheme 300 produces a voltage at node 115 that approaches thresholds from the correct direction such that hysteretic inputs such as Schmitt trigger inputs will function correctly in the system and provide the appropriate thresholds for the periods of charge transfer processes.

The value of the measurable capacitance can be determined using methods similar to the "single-slope" embodiment shown in FIG. 2A. For example, for the embodiment shown in FIG. 3A, the number of charge transfer process iterations executed to charge the filter capacitance 110 to threshold voltage $V_{TH1}$ and to discharge the filter capacitance 110 to threshold voltage $V_{TH2}$ can be identified and used to quantify the value of the measurable capacitance 112. For example, the total number of charging and discharging cycles (i.e. the total number of charge transfers performed, including both performances of the charge transfer processes regardless of the charge-up or charge-down effect) can be tracked and used to determine the measurable capacitance 112. As another example, the number of charging cycles can be tracked and used separately from the number of discharging cycles. Alternatively, only the number of charging cycles or only the number of discharging cycles is tracked and used to determine the measurable capacitance 112; with such an embodiment, the type of charge transfer process that is not tracked and used can be used like a reset, and be of much lower resolution.

Alternatively, and also similar to the "single-slope" embodiment shown in FIG. 2A, the embodiment shown in FIG. 3 can measure the representation of the charge on filter capacitance using a component capable of providing a multi-bit measurement. For example, the measurable capacitance 112 can be provided with pre-fixed numbers of "positive" charge pulses 311 and "negative" charge pulses 312, and the resulting voltage at node 115 on filter capacitance 110 can be digitized into a multi-bit value one or more times per period (e.g. periods 301, 302) to measure the amount of charge transferred without use of separate thresholds $V_{TH1}$ and $V_{TH2}$. These pre-fixed numbers can be fixed by the system or be quasi-dynamic, and can vary between cycles; for example, the pre-fixed numbers can be set shortly before beginning or ending the cycle of charge transfer processes.

Optionally, the charge on filter capacitance 110 can be "set" to a pre-associated value after charging in a first direction using a first type of charge transfer process and "reset" (i.e. set to the pre-associated value or another value) after the charging in a second direction using a second type of charge transfer process.

In still other embodiments, pre-selected numbers of performances of the charge transfer process are combined with the use of thresholds. That is, the charging and/or discharging processes may execute for a pre-determined or pre-established number of cycles, but the charge transfer process in which the voltage on filter capacitance 110 crosses a threshold voltage is identified. FIG. 3A, for example, shows fourteen charge transfer processes and six measurements 330A-F, with the time that each measurement 330A-F is taken illustrated by an arrow. In the illustrated example, seven charge transfer processes and three measurements are performed during each charging or discharging cycle even though threshold voltage $V_{TH1}$ is crossed just prior to the third sample indicated by point 330C and threshold $V_{TH2}$ is crossed just prior to the second sample indicated by point 330E. A third sample is still taken, as indicated by point 330F, and a seventh charge transfer process is still performed even though the second sample indicated that the voltage at node 115 had already crossed threshold $V_{TH2}$. The taking of such additional samples as 330F is optional. However, such additional samples may provide an added advantage, particularly when multiple sensing channels are measured using a common filter capacitance 110, in that the slope direction is relatively constant across channels, even though the measured capacitance may vary from channel to channel. Such embodiments may also provide other advantages such as in improved rejection of incorrect readings of a threshold voltage having been crossed. As discussed above, the performing of additional charge transfer processes is also optional, but may be especially advantageous in systems having sensing channels in physical proximity to each other and running these sensing channels in parallel (simultaneously).

It should also be noted that the measurements 330A-F are shown as taken during later parts of each time period 301, 302 when the possibility that the voltage on the filter capacitance 110 will have crossed the applicable threshold is greater, and not during the earlier part of each time period 301, 302 when this possibility is low. With such an approach, the timing of charging pulses 311 and 312 can be faster and the pulses more frequent during periods when the voltage on filter capacitance 110 is not measured. At least the time associated with measuring can be removed for such performances.

FIG. 3A shows this additional optional feature in that the pulses 311 and 312 used to charge and discharge measurable capacitance 112 need not be equally spaced in time, and are more frequent earlier in the periods 301, 302. As shown in FIG. 3A, the charging and discharging pulses applied to measurable capacitance 112 are initially applied fairly rapidly to speed the sensing process, while later the pulses are applied more slowly to ensure complete sharing of the charge on the measurable capacitance and sufficient time for accurate measurement. In other embodiments, the measurement period may be faster than the non-measurement period, as appropriate. This feature and other features described earlier are not limited to the bi-directional charging scheme shown in FIG. 3A, and indeed may be incorporated into any of the other charging techniques described above as well.

Charging and discharging pulses 311, 312 (or any other charging pulse) can also vary in timing for other reasons, and they need not be equally spaced in time or be of equal duration. In many embodiments, controller 102 could process interrupts or other distractions at virtually any point of the charge transfer process or determination step, since variations in timing are easily tolerated by many of the embodiments shown herein. This is especially true when the sampling time exceeds the time constants for settling. Alternately, intentionally varying the spacing in time of pulses may spread the sampling spectrum to yield improved immunity to narrow-band interference coupled to the measurable capacitance.

As noted above, many of the embodiments described herein may be readily implemented using commercially-available components such as conventional integrated circuits and discrete resistors and/or capacitors. Because of this simplicity, many of the designs are readily adapted to component and/or I/O sharing, as described, for example, in FIG. 1C. This sharing concept may be exploited across many additional sensing channels to create sensors capable of efficiently sensing numerous capacitances 112 with a single controller 102. This can reduce cost and size of the overall system significantly. Indeed, various techniques can be formed for sharing sensing pins on controller 102 and/or any discrete components within the passive network across a wide array of alternate embodiments.

In this embodiment shown in FIG. 1C, a capacitive sensor 175 includes two passive impedances 105A-B. Each passive impedance 105A-B is coupled to a respective measurable capacitance 112A-B and a respective I/O 104A-B at a respective node 113A-B. The filter capacitance 110 is coupled at node 115A to I/O 106A and impedance 105A, and the filter capacitance 110 is coupled at node 115B to I/O 106B and impedance 105B. The capacitance sensor 175 is thus implemented in a manner that shares filter capacitance 110 between the two measurable capacitances 112A-B. In operation, charge transfer processes and determinations can be performed with the measurable capacitances 112A-B separately. For example, when measurable capacitance 112A is active in the charge transfer process, I/O 106B can be driven to a reference voltage (e.g. a power supply voltage) and measurable capacitance 112A, I/Os 104A and 106A, passive impedance 105A, and filter capacitance 110 can function similarly to analogous components shown in FIG. 1B (e.g. measurable capacitance 112, I/Os 104 and 106, passive impedance 105, and filter capacitance 110, respectively). Similarly, when measurable capacitance 112B is active in the charge transfer process, I/O 106A can be driven to a reference voltage (e.g. a power supply voltage) and measurable capacitance 112B, I/Os 104B and 106B, passive impedance 105B, and filter capacitance 110 can function similarly to analogous components shown in FIG. 1B.

By implementing multiple sensing channels on a common controller 102, a number of efficiencies can be realized. Frequently, sensing electrodes used to provide measurable capacitances 112 can be readily formed on a standard printed circuit board (PCB), so duplication of these elements is relatively inexpensive in a manufacturing sense. In a case where the measurable capacitances 112 are expected to be relatively small, then filter capacitance 110 may also be manufacturable in a PCB. In addition, none or one or more resistances, capacitances, and inductances may be formed on a PCB to provide impedances used in passive impedance 105 or elsewhere the passive network including passive impedance 105 and filter capacitance 110. As a result, many of the various features described herein can be readily implemented using conventional manufacturing techniques and structures. However, in some cases, components such as filter capacitance 110, passive impedance 105, and other impedance(s) may be large enough to warrant discrete components in many embodiments. In those cases, these components (e.g. filter capacitance 110) may be implemented with one or more discrete capacitors, resistors, inductors, and/or other discrete components.

Moreover, the total number of I/O's required and the number of components in the passive network can be even further reduced through any sort of time, frequency, code or other multiplexing technique. Arranging the sensing electrodes in various patterns also allows for many diverse types of sensor layouts (including multi-dimensional layouts used in one, two or more-dimensional touchpad sensors) to be formulated. Alternatively, multiple "button"-type touch sensors can be readily detected using the various sensing channels, or any number of other sensor layouts could be created.

An alternate embodiment of a capacitance sensor 400 that uses only a single I/O in controller 102 for each measurable capacitance 112 is shown in FIG. 4A. By using only one I/O for each measurable capacitance, this embodiment allows for an even more efficient implementation of a capacitance sensor in terms of I/O usage, and may be especially useful for multi-sensing-channel implementations. Thus, a proximity sensor with 20 sensing electrodes could be implemented using 20 I/O's on the controller 102. In this embodiment, a single I/O is used to apply the pre-determined voltage to its respective measurable capacitance 112 (e.g. I/O 404A is associated with measurable capacitance 112A, and I/O 404B is associated with measurable capacitance 112B), to read the voltage on its respective filter capacitance 11A-B, and also to reset the charge on its respective filter capacitance 110A-B. The timing diagram of FIG. 5 shows the operation of a single representative I/O pin 404 of FIG. 4A. When multiple pins such as I/O 404A-B are present, the pins may be operated one at a time or simultaneously. FIG. 5 illustrates an operating method analogous to the way that FIG. 2A operates the circuit of FIG. 1B. Methods analogous to those of FIG. 2B or FIGS. 3A-B could also be used to operate the circuit of FIG. 4A (not shown). As shown in trace 510 of FIG. 5, I/O 404's output includes charging pulses 501 that apply the pre-determined voltage to measurable capacitance 112. Between charge pulses 501, I/O 404 is set to a high impedance state such that the measurable capacitance 112 is allowed to share charge with filter capacitance 110 through impedance 105. At reset time 503, I/O 404 is set to a low voltage to reset filter capacitor 110. Because filter capacitor 110 must be reset through passive impedance 105, a relatively long reset period must be used. Voltage trace 502 illustrates how each performance of the charge transfer process including charging voltage pulses 501 and charge sharing between the measurable capacitance 112 and filter capacitance 110 affects the voltage at node 113. The voltage at node 113 can be used as the representation of the charge on filter capacitance 110 and to determine the measured capacitance 112.

It should be noted that in the embodiment illustrated in FIG. 4A the voltage at nodes 115 cannot be measured directly, as those nodes are not coupled directly to an I/O of the controller 102. Thus, in this embodiment the measurable capacitance 112 is determined by measuring the resulting voltage at node 113. Similarly to the alternatives described above, in one embodiment the voltage at node 113 can be compared to a threshold voltage $V_{TH}$. This threshold voltage $V_{TH}$ can be selected to account for the place of measurement at node 113 instead of node 115 if applicable, such as when a voltage drop across passive impedance 105 can be anticipated and compensated for. Alternatively, the compensation for an estimable voltage drop can be achieved in calculations performed to determine measurable capacitance 112. Further, as discussed above, in some embodiments and at certain times the voltage at node 113 is essentially equivalent to the voltage at node 115, such that no difference in measurements exist and needs to be accounted for. With such embodiments, due to the difference in voltage at this node 113 compared to the voltage at 115 during at least some portions of the charge transfer process, it would be desirable to select a time for determination where the voltage at node 113 tracks the voltage at node 115.

At the end of the charging cycle (e.g. after the voltage at node 113 exceeds the threshold voltage $V_{TH}$, as shown in FIG. 5), the I/O 404 applies a suitable reset voltage to reset the charge on filter capacitance 110. In the embodiment of FIGS. 4A and 5, for example, the I/O initially applies pulses of logic "high" values to provide a positive charge to measurable capacitance that is then shared with filter capacitance 110, and then resets the filter capacitance 110 by driving a logic "low" or "ground" for a period of time sufficient to discharge filter capacitance 110 through passive impedance 105. Alternatives are contemplated. Again, other sign conventions or equivalent methods of operation could be formulated. As another example alternative, measurable capacitance 112 may be charged or discharged for a pre-set number of performances of the charge transfer process, with the voltage on filter capacitance 110 being measured as a multi-bit value after the pre-set number of performances rather than as a single-bit value by comparison with a threshold. In still other embodiments, bi-directional charge application similar to that shown in FIG. 3A could be applied.

Figure 4B:
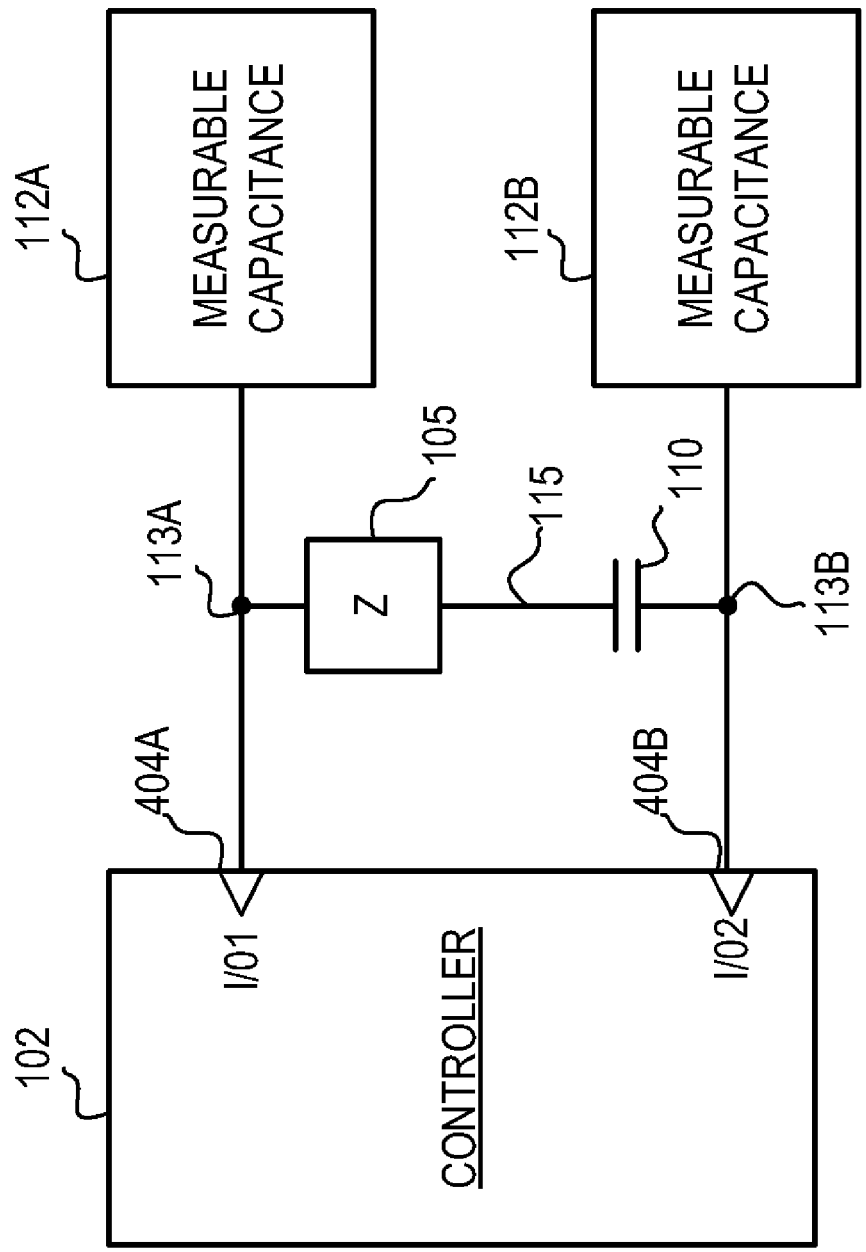
Figure 5:
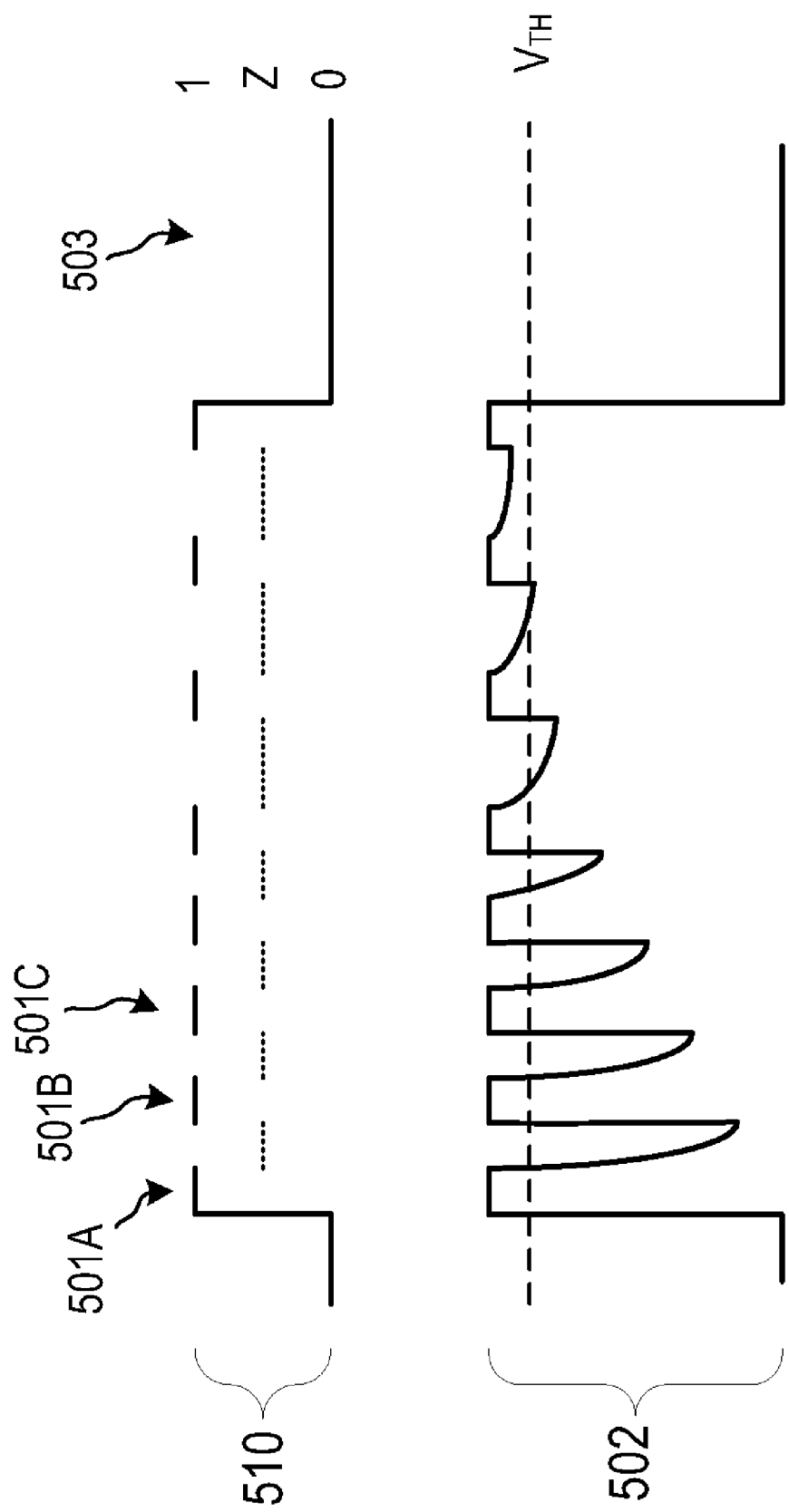
FIG. 5 is a timing diagram showing an exemplary technique for operating a capacitance sensor such as the sensor shown in FIG. 4A.

FIG. 4B illustrates another embodiment with capacitance sensor 420. This embodiment of FIG. 4B allows further reduction of component count and I/Os used in that impedance 105 and filter capacitance 110 is shared between two sensing channels corresponding to I/O 404A and I/O 404B. In this embodiment, the charge transfer process can be performed with measurable capacitance 112A by providing charging pulses from I/O 404A to apply the pre-determined voltage while I/O 404B is set to a reference value (e.g. I/O 404B can be set to ground while positive voltage pulses of $+V_{cc}$ are provided on I/O 404A, or vice versa with I/O 404B set to $+V_{cc}$ while negative voltage pulses of ground are provided on I/O 404A. Other convenient voltages such as $-V_{cc}$ or a divided version of any of these voltages can also be used). Charge can then be allowed to share by stopping the applying of the pre-determined voltage and holding I/O 404A to a high impedance state while keeping I/O 404B to the same reference voltage. After one or more performances of this charge transfer process, the resulting voltage at node 113A and on filter capacitance 110 can then be read with I/O 404A using any of the techniques described above. This resulting voltage on filter capacitance 110 is representative of the charge on filter capacitance 110, and can be used with the number of times the charge transfer process was performed to produce a value of the measurable capacitance 112. A similar charge transfer process can be performed with measurable capacitance 112B by providing voltage pulses on I/O 404B to apply the pre-determined voltage while holding I/O 404A at a reference value (e.g. ground), and then allowing charge to share between the measurable capacitance 112B and the filter capacitance 110. One or more measurements of the voltage at node 113B can be taken using I/O 404B. These measurement(s) and the number of performances of the charge transfer process can be used to produce a value of the measurable capacitance 112B.

Figure 4C:
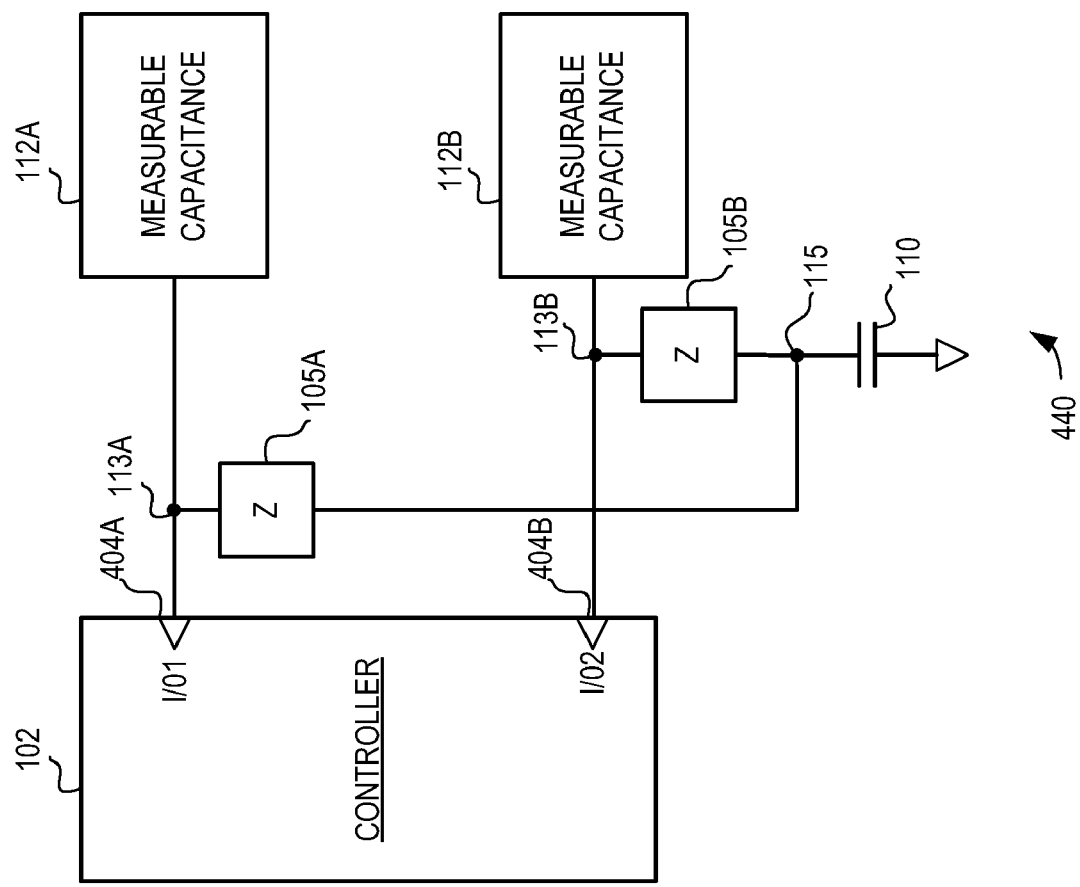

FIG. 4C illustrates another capacitance sensor embodiment 440. In this embodiment, the filter capacitance 110 is shared between two sensing channels corresponding to I/Os 404A and 404B. Each I/O 404A, 404B is coupled to a measurable capacitance 112A-B (respectively), and to filter capacitance 110 via an appropriate respective passive impedance 105A-B. Operation of the sensor would parallel that of sensor 400 shown in FIG. 4A, except that the operation of sensors 400 and 440 differ in that each measurable capacitance 112A-B of sensor 440 would be determined separately in time without the option of truly contemporaneous charge transfer processes and measurements. That is, parallel operation would typically be more convenient with the sensor of FIG. 4A than the sensor of FIG. 4C; the FIG. 4C sensor, however, contains one fewer component with the sharing of filter capacitance 110. For circuit 440B, I/O 404B is held at high impedance when measurable capacitance 112A is used in a charge transfer process driven by I/O 404A or when node 113A is being measured using I/O 404A, and I/O 404A held at a high impedance state when measurable capacitance 112B and I/O 404B are used in a charge transfer or when node 113B is being measured using I/O 404B. Constantly coupling all of the measurable capacitances to the filter capacitance using such a scheme may degrade sensor performance (e.g. some charge may accumulate onto the inactive measurable capacitances or the inactive measurable capacitances may couple in extra noise), such degradation is usually acceptable and often not noticeable. In application, the value of filter capacitance 110 may be a thousand or more times that of any measurable capacitances that the system measures, such that the filter capacitance will dominate charge accumulation and define the voltage at node 115. The sensor shown in FIG. 4C could be further modified by coupling node 115 to an additional I/O on controller 102 (not shown). This additional coupling to the additional I/O can facilitate resetting and measurement of the filter capacitance 110. This additional coupling may also facilitate sensing methodologies such as those shown in FIG. 3B traces 352, 354 where fast reset to supply is desirable. The sensor shown in FIG. 4C can also be further modified by coupling the side of filter capacitance 110 opposite node 115 to an additional I/O on controller 102 (not shown) instead of ground. This additional coupling to the additional I/O can provide another sensing channel that can be used to measure a measurable capacitance (not shown) coupled to that node opposite node 115 without any further additional components. Many other modifications of sensor 440 exist and are contemplated.

The various concepts and techniques described above can be further enhanced in many ways. The exemplary embodiment shown in FIG. 6, for example, shows a two-channel single-I/O-per-channel implementation similar to that of FIG. 4A. In this embodiment, the measurable capacitances are defined, at least in part, by a plurality of sensor electrodes 601A-B and an object, such as a finger or stylus (not shown), proximate the sensor electrodes 601A-B. Furthermore, this embodiment includes a compensation circuit 125 as described above. This embodiment also includes a guarding electrode 602 that serves to shield the sensor electrodes 601 from unintended electrical coupling.

Figure 6:
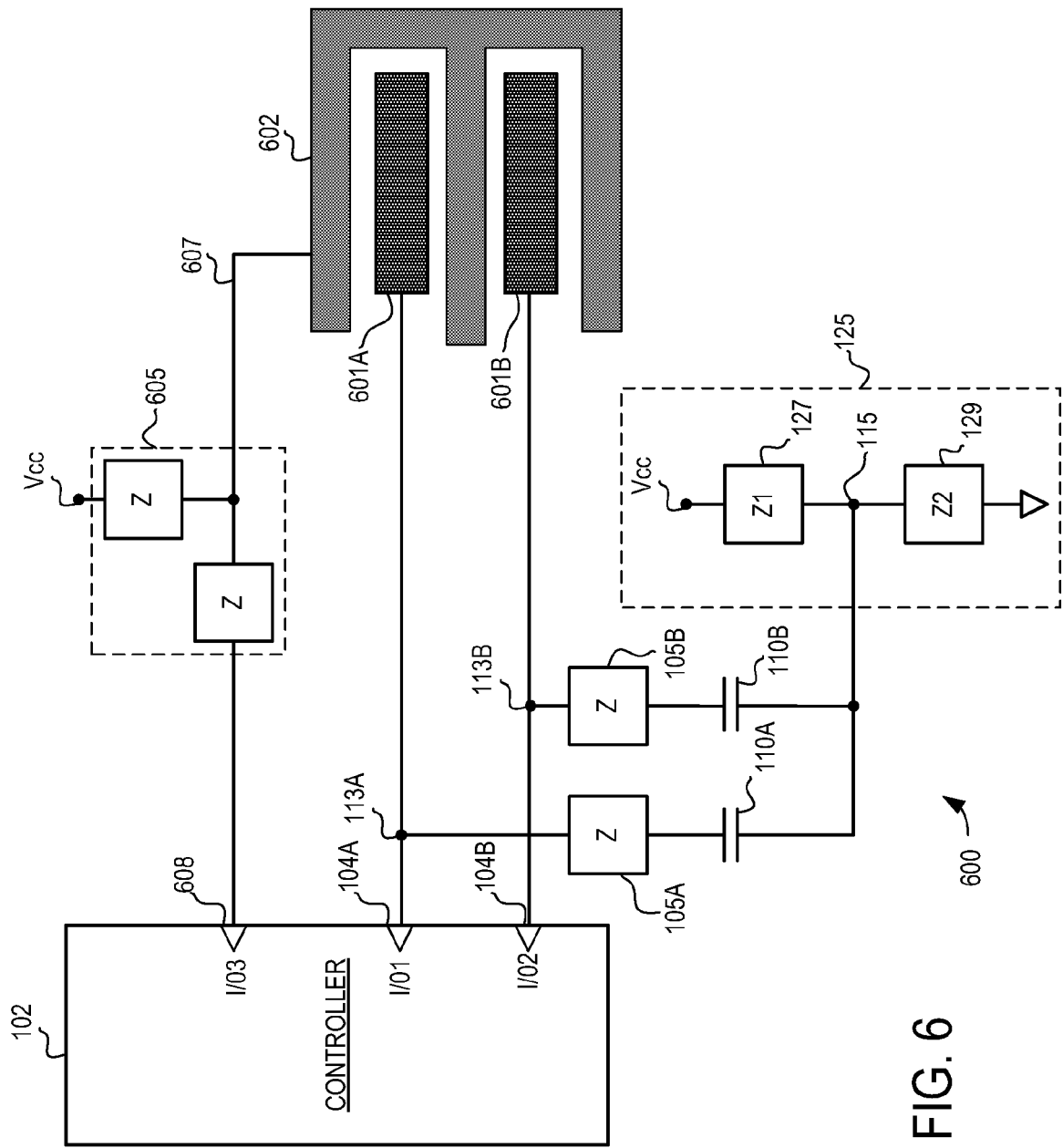
FIG. 6 is a block diagram showing an alternate embodiment of a multi-channel capacitance sensor incorporating a guard electrode.

In the embodiment shown in FIG. 6, individual sensing electrodes 601A-B are used to capacitively detect the presence of an object and thus provide their respective measurable capacitances. During operation, a guarding signal is provided on the guarding electrode 602 using a low impedance path 607. The guarding signal helps to shield the sensor electrodes from unintended coupling with the environment and helps to reduce the net charge transferred from the guarding electrode 602 onto the filter capacitance(s) (e.g. 110A-B) during the course of the charge transfer processes leading to the determination of the measurable capacitance(s). During a portion of the applying of the pre-determined voltage, the guard signal can apply a voltage to the guarding electrode 602 approximately equal to the voltage applied to the predetermined voltage. Then, before the charge sharing between the active sensing electrode (e.g. 601A-B) with its associated filter capacitance (e.g. 11A-B) ends, the voltage of the guard signal may be changed to be approximately equal to the voltage on the associated filter capacitance (e.g. 110A-B). If a constant voltage is chosen to approximate the voltage on the associated filter capacitance (an approximation since the voltage on the filter capacitance changes during and between repetitions of the charge transfer process), the voltage applied to the guarding electrode 602 may be changed to a voltage between the appropriate threshold voltage ($V_{TH}$) and the voltage on the associated filter capacitance after reset. The absolute values of the voltages of the guard signal are less important than the voltage swing (i.e. change in voltage) of the guard signal. For example, an offset between the guarding electrode voltage and the sensing electrode voltage would not affect the usefulness of the guard, since for charge transfer through a capacitance, the voltage swing (i.e. change in voltage) is important and the absolute voltage values are not.

These guarding voltages of the guard signal may be generated in any manner, such as by tying the guarding electrode 602 to a guarding voltage generator circuit of any sort. In the exemplary embodiment shown in FIG. 6, an impedance divider circuit 605 suitably produces at least two different values of voltages depending upon the signal applied by I/O 108 of controller 102 and the types and values chosen for the components comprising impedance divider circuit 605. Specifically, an impedance divider 605 composed of a resistive voltage divider can be used. With such a voltage divider, if the signal from I/O 608 is $+V_{cc}$ or if the I/O 608 is held at high impedance, the guarding voltage is $+V_{cc}$. Alternatively, if the signal from I/O 608 is GND, the guarding voltage is a predetermined fraction of $V_{cc}$ such as $(+V_{cc})/2$. As one example, the guarding voltage of the guard signal is changed between the application of the charging pulses that apply the pre-determined voltage and the subsequent sharing period. The guarding voltage of the guard signal can also change between repetitions of the charge transfer process, such as between a reset and the last measurement used in a determination of the measurable capacitance. Alternate embodiments could implement impedance divider circuits with one or more resistances, inductances, or capacitances for ease of design, ease of production, more effective guard signals, and the like. Digital-to-analog converters, pulse-width modulators, and the like can also be used to generate the guard signal. The various charge transfer sensing techniques described herein, coupled with the ease of multi-channel integration, provide for highly efficient application of guard signals. Nevertheless, guarding is an optional feature that may not be found on all embodiments.

Figure 7:
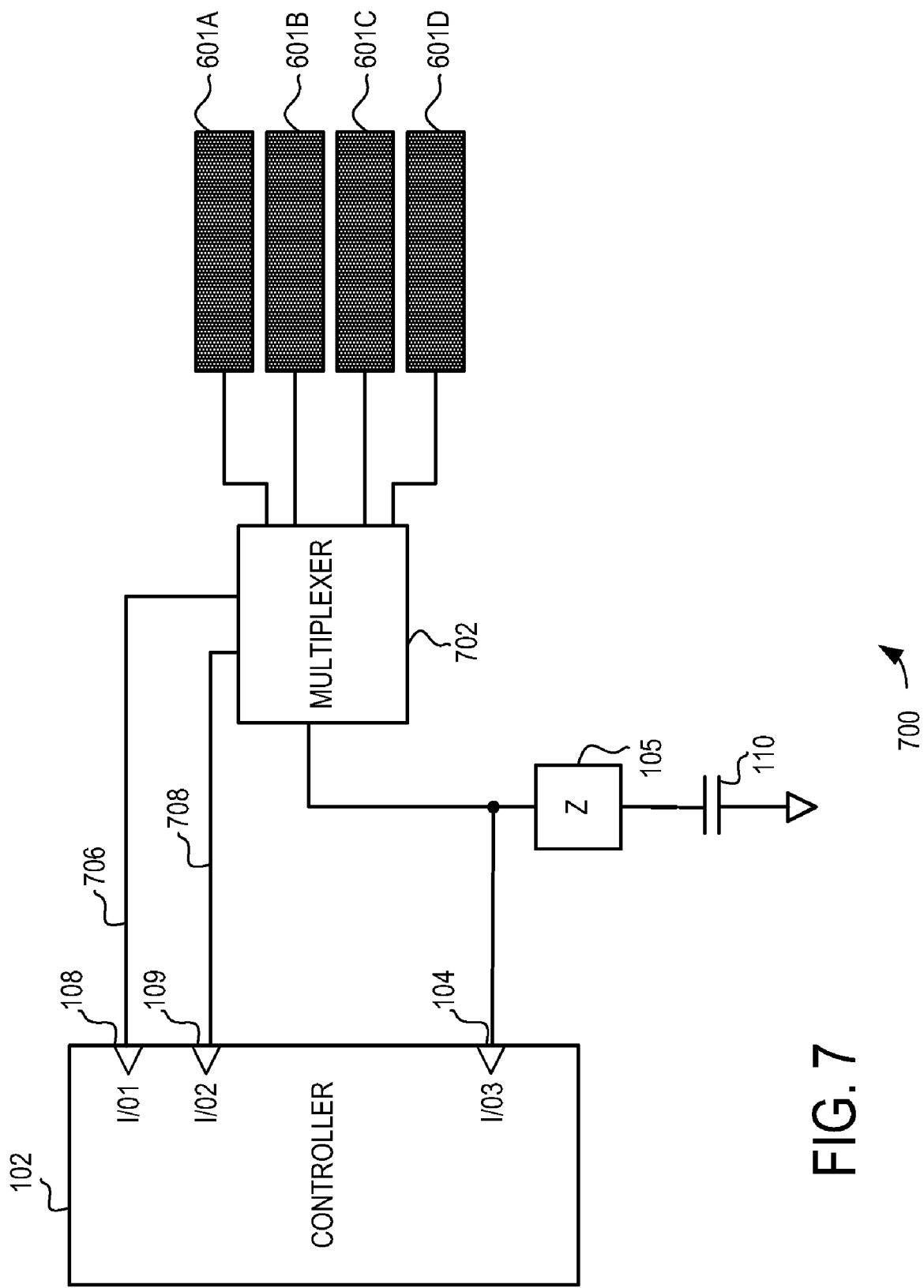
FIG. 7 is a block diagram showing another alternate embodiment of a multi-channel capacitance sensor.

The exemplary sensing circuit 700 of in FIG. 7 shows multiple sensing electrodes providing multiple measurable capacitances connected to controller 102 through a multiplexer 702. In the embodiment shown, two I/Os 108, 109 of controller 102 are used to provide selection signals along paths 706, 708 to multiplexer 702 that select a desired sensor electrode 601A-D and associated measurable capacitance for sensing. Thus, the multiplexer 702 is used to select which sensor electrode 601 is measured for its associated measurable capacitance. Although multiplexer 702 is, strictly speaking, an active device, the presence of the multiplexer 702 does not affect the practical operation of the passive network made up of impedance 105 and filter capacitance 110. That is, whatever sensor electrode 601A-D is selected on multiplexer 702, the operation of the sensing circuitry remains otherwise consistent with the descriptions provided above. Hence, the use of a "passive network" does not entirely preclude the use of one or more active components outside of the passive network and elsewhere in the capacitance sensor in various alternate embodiments.

Figure 8:
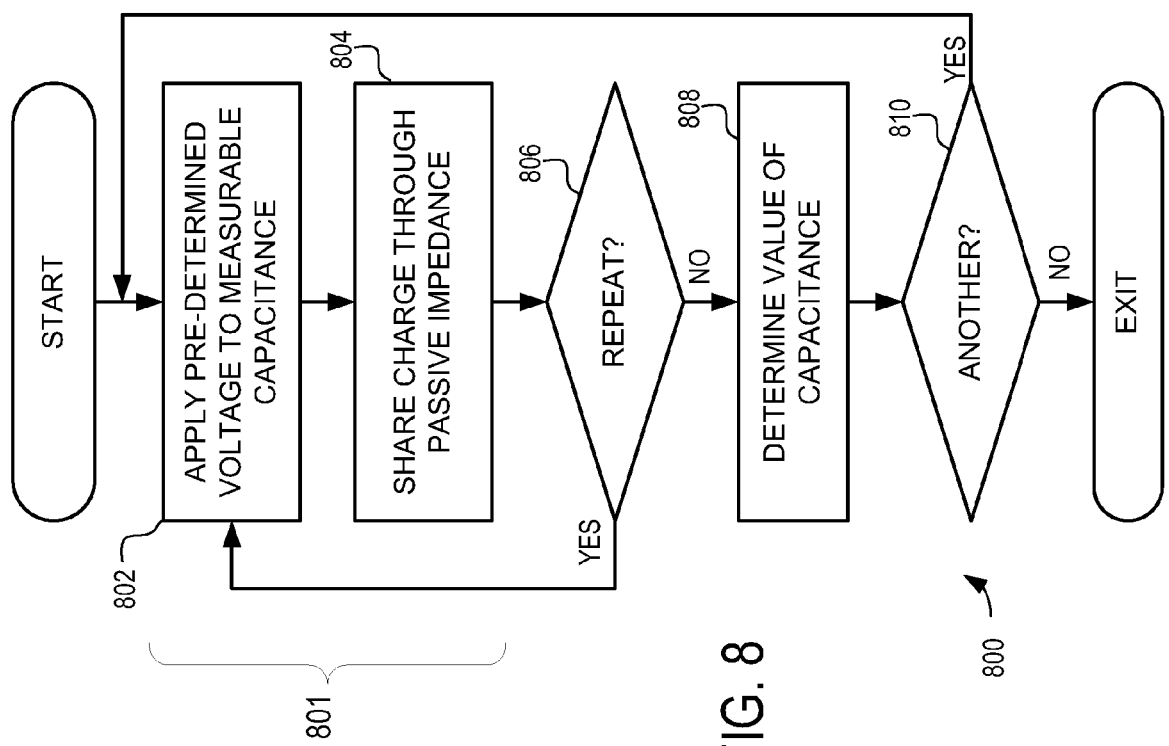
FIG. 8 is a flowchart of an exemplary technique for detecting capacitance using switched charge transfer techniques.

With reference now to FIG. 8, an exemplary technique 800 for detecting a measurable capacitance using switched charge transfer techniques suitably includes the broad steps of performing a charge transfer process 801 for two or more times (as repeated by step 806) and subsequently determining the value of the measurable capacitance (step 808). As noted above, the charge transfer process 801 includes applying a pre-determined voltage to the measurable capacitance (step 802) and then allowing the measurable capacitance to share charge with a filter capacitance through a passive impedance that remains coupled to both the measurable capacitance and to the filter capacitance throughout the applying (step 802) and allowing steps (step 804). "Sharing" charge in this context can refer to actively switching that is unrelated to coupling or decoupling of the passive impedance with the measurable capacitance or the filter capacitance, otherwise directing the transfer of charge, or passively allowing the charge to transfer through impedance through quiescence or other inaction. The charge transfer process can repeat (step 806), and may repeat once, tens, hundreds, or many more times until the charge on filter capacitance exceeds a threshold voltage, until the process 801 has executed for a pre-determined number of times, and/or according to any other scheme. For those embodiments that include the step of resetting the filter capacitor, this resetting step can be inserted before the first repetition of step 802.

With the charge transfer process 801 performed for the appropriate number of times, the value of the measurable capacitance is determined (step 808). Although additional charge transfer processes may still be performed after the appropriate number of performances of the charge transfer process, these additional charge transfer processes are not used in the determination of the value of the measurable capacitance. As noted above, the determination of the measurable capacitance 808 may take place according to any technique. In various embodiments, the determination is made based upon a representation of the amount of charge present on the filter capacitance, as well as the number of times that the charge transfer process 801 was performed to produce that representation of the amount of charge. As noted just previously, the particular number of times that process 801 is performed may be pre-established, determined according to the voltage on filter capacitance crossing a threshold voltage, or any other factor as appropriate.

Steps 802-808 can be repeated as needed (step 810). For example, in a proximity sensor implementation with multiple sensor electrodes, typically each electrode corresponds to a measurable capacitance. In such an implementation, the measurable capacitance corresponding to each sensor electrode would typically be determined many times per second. This provides the ability to determine the presence of objects near the proximity sensor, and thus facilitates use of the device for user input. Thus, the process can be repeated at a high rate for each sensor electrode each second.

Process 800 may be executed in any manner. In various embodiments, process 800 is directed by software or firmware residing in a digital memory, such as a memory located within or in communication with a controller, or any other digital storage medium (e.g. optical or magnetic disk, modulated signal transmitted on a carrier wave, and/or the like). Process 800 and its various equivalents and derivatives discussed above can also be executed with any type or combination of analog circuitry, programmed circuitry, or other logic as appropriate.

Figure 9:
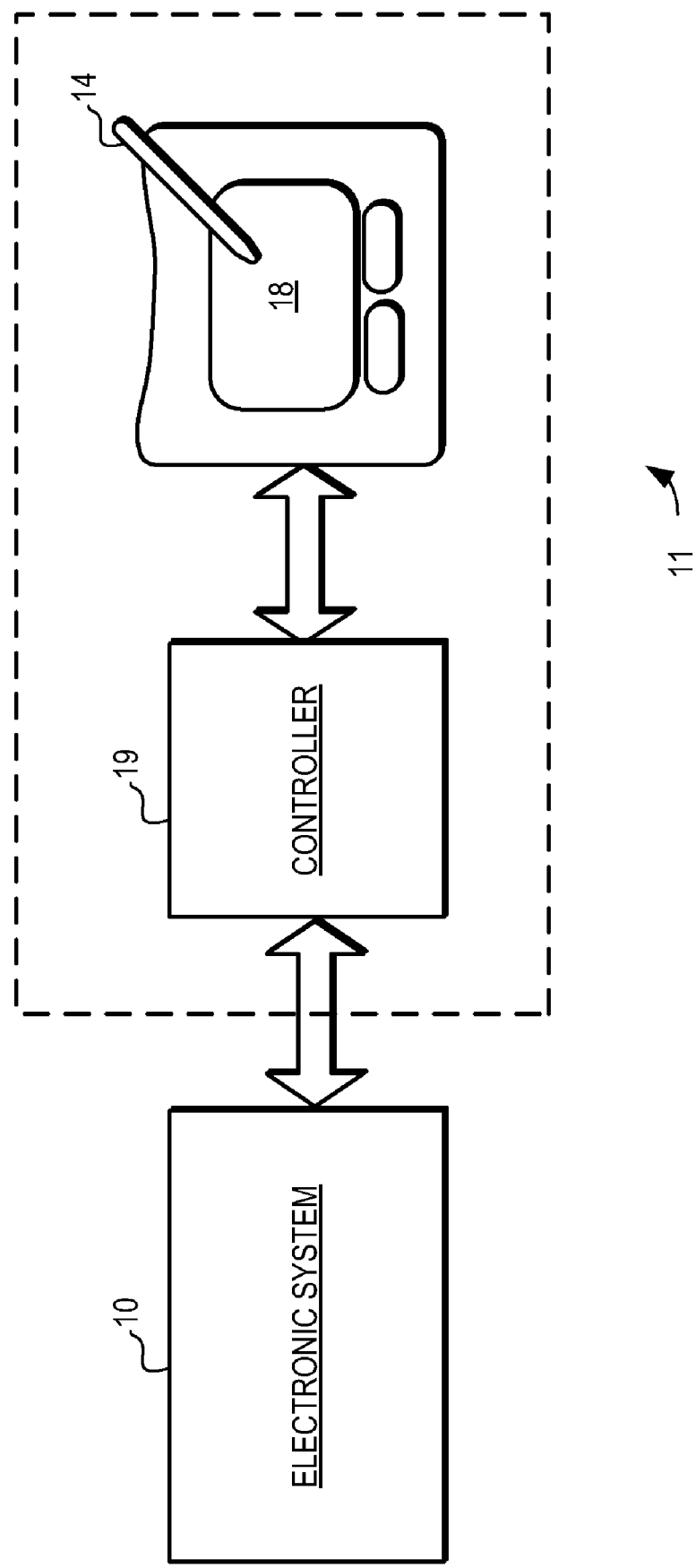
FIG. 9 is a schematic diagram of a proximity sensor device using a capacitance sensor coupled with an electronic system.

As stated above, the devices and methods for determining capacitance are particularly applicable for use in proximity sensor devices. Turning now to FIG. 9, a block diagram is illustrated of an exemplary electronic system 10 that is coupled to a proximity sensor device 11. Electronic system 10 is meant to represent any type of personal computer, portable computer, workstation, personal digital assistant, video game player, communication device (including wireless phones and messaging devices), media device, including recorders and players (including televisions, cable boxes, music players, and video players) or other device capable of accepting input from a user and of processing information. Accordingly, the various embodiments of system 10 may include any type of processor, memory or display. Additionally, the elements of system 10 may communicate via a bus, network or other wired or wireless interconnection. The proximity sensor device 11 can be connected to the system 10 through any type of interface or connection, including I2C, SPI, PS/2, Universal Serial Bus (USB), Bluetooth, RF, IRDA, or any other type of wired or wireless connection to list several non-limiting examples.

Proximity sensor device 11 includes a controller 19 and a sensing region 18. Proximity sensor device 11 is sensitive to the position of an input 14 (which can be provided by one or more fingers, styli, and/or other input objects) in the sensing region 18, and can detect the input 14 by measuring the resulting changes in capacitance due to input 14. "Sensing region" 18 as used herein is intended to broadly encompass any space above, around, in and/or near the proximity sensor device 11 wherein the sensor is able to detect a position of the object. In a conventional embodiment, sensing region 18 extends from a surface of the sensor in one or more directions for a distance into space until signal-to-noise ratios prevent input detection. This distance may be on the order of less than a millimeter, millimeters, centimeters, or more, and may vary significantly with the sensor design and the sensor performance (e.g. accuracy or resolution) desired. Accordingly, the planarity and curvature, size, shape and exact locations of the particular sensing regions 18 will vary widely from embodiment to embodiment.

In operation, proximity sensor device 11 suitably detects a position of input 14 by measuring the measurable capacitance(s) associated with the plurality of sensing electrodes which are affected by one or more fingers, styli, and/or other objects within sensing region 18. And, using controller 19, proximity sensor device 11 provides electrical or electronic indicia of the position to the electronic system 10. The system 10 appropriately processes the indicia to accept inputs from the user for any appropriate purpose and produces any appropriate responses, as discussed earlier.

The proximity sensor device 11 can use discrete electrodes, arrays of electrodes, or any other arrangement of capacitive sensor electrodes to support any number of sensing regions 18. The proximity sensor device can also vary in the type of information provided, such as to provide "one-dimensional" position information (e.g. along a sensing region) as a scalar, "two-dimensional" position information (e.g. horizontal/vertical axes, angular/radial, or any other axes that span the two dimensions) as a combination of values, and the like.

The controller 19, sometimes referred to as a proximity sensor processor or touch sensor controller, generally directs the process used to measure capacitance using any of the various techniques described above. Here, controller 19 also communicates with the electronic system 10. The controller 19 can perform a variety of additional processes to implement the proximity sensor device 11. For example, the controller 19 can select or connect individual measurable capacitances, calculate position or motion information based on the values of the measurable capacitances, report a position or motion when a threshold is reached, interpret and wait for a valid tap/stroke/character/button/gesture sequence before reporting it to the electronic system 10 or indicating it to the user, or any of a multitude of different processes.

In this specification, the term "controller" is defined to include one or more processing elements that are adapted to perform the recited operations. Thus, the controller 19 can comprise all or part of one or more integrated circuits, firmware code, and/or software code.

Again, as the term is used in this application, the term "electronic system" broadly refers to any type of device that communicates with proximity sensor device 11. The electronic system 10 could thus comprise any type of device or devices that a touch sensor device can be implemented in or coupled to. The proximity sensor device 11 could be implemented as part of the electronic system 10, or coupled to the electronic system 10 using any suitable technique. As non-limiting examples the electronic system 10 could thus comprise any type of computing device, media player, communication device, or another input device (such as another touch sensor device or keypad). In some cases the electronic system 10 is itself a peripheral to a larger system. For example, the electronic system 10 could be a data input or output device, such as a remote control or display device, that communicates with a computer or media system (e.g., remote control for television) using a suitable wired or wireless technique. It should also be noted that the various elements (processor, memory, etc.) of the electronic system 10 could be implemented as part of an overall system, as part of the touch sensor device, or as a combination thereof. Additionally, the electronic system 10 could be a host or a slave to the proximity sensor device 11.

It should also be noted that the term "proximity sensor device" is intended to encompass not only conventional proximity sensor devices, but also a broad range of equivalent devices that are capable of detecting the position of one or more fingers, pointers, styli and/or other objects. Such devices may include, without limitation, touch screens, touch pads, touch tablets, biometric authentication devices, handwriting or character recognition devices, and the like. Similarly, the terms "position" or "object position" as used herein are intended to broadly encompass absolute and relative positional information, and also other types of spatial-domain information such as velocity, acceleration, and the like, including measurement of motion in one or more directions. Various forms of positional information may also include time history components, as in the case of gesture recognition and the like. Accordingly, proximity sensor devices can appropriately detect more than the mere presence or absence of an object and may encompass a broad range of equivalents.

It should also be understood that the mechanisms of the present invention are capable of being distributed as a program product in a variety of forms. For example, the mechanisms of the present invention can be implemented and distributed as a proximity sensor program on a computer-readable signal bearing media. Additionally, the embodiments of the present invention apply equally regardless of the particular type of signal bearing media used to carry out the distribution. Examples of signal bearing media include: recordable media such as memory cards, optical and magnetic disks, hard drives, and transmission media such as digital and analog communication links.

Various other modifications and enhancements may be performed on the structures and techniques set forth herein without departing from their basic teachings. Accordingly, there are provided numerous systems, devices and processes for detecting and/or quantifying a measurable capacitance. While at least one exemplary embodiment has been presented in the foregoing detailed description, it should be appreciated that a vast number of variations exist. The various steps of the techniques described herein, for example, may be practiced in any temporal order, and are not limited to the order presented and/or claimed herein. It should also be appreciated that the exemplary embodiments described herein are only examples, and are not intended to limit the scope, applicability, or configuration of the invention in any way. Various changes can therefore be made in the function and arrangement of elements without departing from the scope of the invention as set forth in the appended claims and the legal equivalents thereof.

What is claimed is:

1. A method for measuring a measurable capacitance, the method comprising the steps of:
    performing a first charge transfer process for a first number of times equal to at least two, wherein the first charge transfer process comprises the steps of:
        applying a first voltage to the measurable capacitance; and
        allowing the measurable capacitance to share charge through a passive impedance with a filter capacitance, wherein the passive impedance remains coupled to both the measurable capacitance and the filter capacitance throughout the applying and allowing steps of the first charge transfer process;
    performing a second charge transfer process for a second number of times equal to at least one, wherein the second charge transfer process comprises the steps of:
        applying a second voltage to the measurable capacitance; and
        allowing the measurable capacitance to share charge with the filter capacitance through the passive impedance, wherein the first voltage transfers charge in a first direction, and the second voltage transfers charge in a second direction opposite the first direction, and wherein the passive impedance remains coupled to both the measurable capacitance and the filter capacitance throughout the applying and allowing steps of the second charge transfer process; and
    determining a value of the measurable capacitance from the first charge transfer process and the second charge transfer process.

2. The method of claim 1 wherein the first charge transfer process further comprises the step of comparing the voltage on the filter capacitance with a first threshold voltage, and wherein the second charge transfer process further comprises the step of comparing the voltage on the filter capacitance with a second threshold voltage, and wherein the first threshold voltage and the second threshold voltage are substantially equal.

3. The method of claim 1 wherein the first charge transfer process further comprises the step of comparing the voltage on the filter capacitance with a first threshold voltage, and wherein the second charge transfer process further comprises the step of comparing the voltage on the filter capacitance with a second threshold voltage, and wherein the first threshold voltage and the second threshold voltage are substantially different.

4. The method of claim 1 wherein the passive impedance comprises a resistance.

5. The method of claim 1 wherein the first charge transfer process further comprises the step of resetting the voltage on the filter capacitance to a first reset voltage, and wherein the second charge transfer process further comprises the step of resetting the voltage on the filter capacitance to a second reset voltage.

6. The method of claim 1 wherein:
    the first charge transfer process further comprises the steps of:
        comparing the voltage on the filter capacitance with a first threshold voltage; and
        resetting the voltage on the filter capacitance to a first reset voltage in response to the voltage on the filter capacitance crossing the first threshold voltage; and
    the second charge transfer process further comprises the steps of:
        comparing the voltage on the filter capacitance with a second threshold voltage; and
        resetting the voltage on the filter capacitance to a second reset voltage in response to the voltage on the filter capacitance crossing the second threshold voltage.

7. The method of claim 6 wherein the step of determining a value of the measurable capacitance comprises:
    determining the value of the measurable capacitance from a number of first charge transfer processes performed for the voltage on the filter capacitance to cross the first threshold voltage and from a number of second charge transfer processes performed for the voltage on the filter capacitance to cross the second threshold voltage.

8. The method of claim 1 wherein the step of determining a value of the measurable capacitance comprises:
    determining the value of the measurable capacitance from a quantity of the first charge transfer processes and the second charge transfer processes performed.

9. A proximity sensor comprising:
    a sensor electrode having a measurable capacitance;
    a switch coupled to the measurable capacitance;
    a passive network coupled to the measurable capacitance and the switch, the passive network comprising a passive impedance and a filter capacitance, wherein the passive impedance statically couples the measurable capacitance to the filter capacitance; and
    a controller coupled to the switch, wherein the controller is configured to perform a first charge transfer process for a first number of times equal to at least two and a second charge transfer process for a second number of times equal to at least one, wherein the first charge transfer process comprises:
        applying a first voltage to the measurable capacitance; and
        allowing the measurable capacitance to share charge through a passive impedance with a filter capacitance, wherein the passive impedance remains coupled to both the measurable capacitance and the filter capacitance throughout the applying and allowing of the first charge transfer process;

and wherein the second charge transfer process comprises:
applying a second voltage to the measurable capacitance; and
allowing the measurable capacitance to share charge with the filter capacitance through the passive impedance, wherein the first voltage transfers charge in a first direction, and the second voltage transfers charge in a second direction opposite the first direction, and wherein the passive impedance remains coupled to both the measurable capacitance and the filter capacitance throughout the applying and allowing of the second charge transfer process; and and wherein the controller is further configured to determine a value of the measurable capacitance from the first charge transfer process and the second charge transfer process.

10. The proximity sensor of claim 9 wherein the first charge transfer process further comprises comparing the voltage on the filter capacitance with a first threshold voltage, and wherein the second charge transfer process further comprises comparing the voltage on the filter capacitance with a second threshold voltage, and wherein the first threshold voltage and the second threshold voltage are substantially equal.

11. The proximity sensor of claim 9 wherein the first charge transfer process further comprises comparing the voltage on the filter capacitance with a first threshold voltage, and wherein the second charge transfer process further comprises comparing the voltage on the filter capacitance with a second threshold voltage, and wherein the first threshold voltage and the second threshold voltage are substantially different.

12. The proximity sensor of claim 9 wherein the passive impedance comprises a resistor.

13. The proximity sensor of claim 9 wherein the first charge transfer process further comprises resetting the voltage on the filter capacitance to a first reset voltage, and wherein the second charge transfer process further comprises resetting the voltage on the filter capacitance to a second reset voltage.

14. The proximity sensor of claim 9 wherein:
the first charge transfer process further comprises:
comparing the voltage on the filter capacitance with a first threshold voltage; and
resetting the voltage on the filter capacitance to a first reset voltage in response to the voltage on the filter capacitance crossing the first threshold voltage; and
the second charge transfer process further comprises:
comparing the voltage on the filter capacitance with a second threshold voltage; and
resetting the voltage on the filter capacitance to a second reset voltage in response to the voltage on the filter capacitance crossing the second threshold voltage.

15. The proximity sensor of claim 14 wherein the controller is configured to determine the value of the measurable capacitance from a number of first charge transfer processes performed for the voltage on the filter capacitance to cross the first threshold voltage and from a number of second charge transfer processes performed for the voltage on the filter capacitance to cross the second threshold voltage.

16. The proximity sensor of claim 9 wherein the controller is configured to determine the value of the measurable capacitance from a quantity of the first charge transfer processes performed and the second charge transfer processes performed.

17. The proximity sensor of claim 9 wherein the controller is further configured to perform a second charge transfer process for a second number of times equal to at least one, wherein the second charge transfer process comprises:
applying an opposing voltage to the measurable capacitance and allowing the measurable capacitance to share charge with the filter capacitance through the passive impedance, wherein the pre-determined voltage causes charge transfer in a first direction, and the opposing voltage causes charge transfer in a second direction opposite the first direction.

18. The proximity sensor of claim 17 wherein the controller is further configured to reset the voltage of the filter capacitance to a first value after the performing of the charge transfer process for the number of times and to reset the voltage of the filter capacitance to a second value after the performing of the second charge transfer process for the second number of times.

19. The proximity sensor of claim 17 wherein the controller is configured to perform the charge transfer process is at least until the voltage of the filter capacitance crosses a first threshold and to perform the second charge transfer process at least until the voltage of filter capacitance crosses a second threshold.

20. A proximity sensor comprising:
a sensor electrode having a measurable capacitance;
a switch coupled to the sensor electrode;
a passive network coupled to the sensor electrode and the switch, the passive network comprising a passive impedance and a filter capacitance, wherein the passive impedance statically couples the sensor electrode to the filter capacitance; and
a controller coupled to the switch, wherein the controller is configured to perform a charge transfer process for a number of times greater than one, wherein the charge transfer process comprises applying a pre-determined voltage to the measurable capacitance using the switch and allowing the measurable capacitance to share charge with the filter capacitance through the passive impedance, and wherein the controller is further configured to determine a voltage of the filter capacitance and determine a value of the measurable capacitance as a function of the voltage of the filter capacitance.

21. The proximity sensor of claim 20 further comprising a compensation circuit coupled to the filter capacitance configured to add at least a portion of a reference voltage to the filter capacitance.

22. The proximity sensor of claim 20 wherein the controller is further configured to reset the voltage on the filter capacitance.

23. The proximity sensor of claim 20 wherein the controller is further configured to determine a value of the measurable capacitance as a function of the voltage of the filter capacitance by ascertaining the number of times the charge transfer process is performed.

24. The proximity sensor of claim 20 wherein the controller is further configured to determine a value of the measurable capacitance as a function of the voltage of the filter capacitance by ascertaining the number of times the charge transfer process is performed for the voltage of the filter capacitance to pass a threshold voltage.

25. The proximity sensor of claim 20 wherein the controller is further configured to reset the voltage on the filter capacitance in response to the voltage of the filter capacitance passing a threshold voltage.

26. The proximity sensor of claim 20 wherein the measurable capacitance comprises a transcapacitance between a driving electrode and the sensing electrode.

* * * * *